United States Patent
Nagahata

(10) Patent No.: US 9,868,281 B2
(45) Date of Patent: Jan. 16, 2018

(54) INKJET HEAD

(71) Applicant: ROHM CO., LTD., Kyoto (JP)

(72) Inventor: Takaya Nagahata, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/585,569

(22) Filed: May 3, 2017

(65) Prior Publication Data

US 2017/0232738 A1 Aug. 17, 2017

Related U.S. Application Data

(63) Continuation of application No. 15/227,956, filed on Aug. 3, 2016, now Pat. No. 9,676,188, which is a
(Continued)

(30) Foreign Application Priority Data

| Jul. 28, 2014 | (JP) | 2014-153165 |
| Sep. 3, 2014 | (JP) | 2014-179163 |
| Sep. 3, 2014 | (JP) | 2014-179167 |
| Jul. 10, 2015 | (JP) | 2015-139079 |

(51) Int. Cl.

| B41J 2/14 | (2006.01) |
| B41J 2/045 | (2006.01) |
| B41J 2/175 | (2006.01) |
| H01L 41/047 | (2006.01) |
| H01L 41/053 | (2006.01) |
| H01L 41/08 | (2006.01) |
| H01L 41/083 | (2006.01) |
| H01L 41/09 | (2006.01) |

(Continued)

(52) U.S. Cl.
CPC ....... *B41J 2/04581* (2013.01); *B41J 2/04541* (2013.01); *B41J 2/14233* (2013.01); *B41J 2/17596* (2013.01); *H01L 41/0472* (2013.01); *H01L 41/0475* (2013.01); *H01L 41/0533* (2013.01); *H01L 41/083* (2013.01); *H01L 41/0815* (2013.01); *H01L 41/0973* (2013.01); *H01L 41/1876* (2013.01); *B41J 2/161* (2013.01); *B41J 2/1646* (2013.01); *B41J 2002/14241* (2013.01); *B41J 2002/14306* (2013.01); *B41J 2002/14491* (2013.01); *B41J 2202/03* (2013.01); *B41J 2202/05* (2013.01); *B41J 2202/07* (2013.01); *B41J 2202/13* (2013.01); *B41J 2202/22* (2013.01)

(58) Field of Classification Search
CPC .. B41J 2/3352; B41J 2202/13; B41J 2/14201; B41J 2/14233; B41J 2002/14241
See application file for complete search history.

(56) References Cited

U.S. PATENT DOCUMENTS 5,889,539 A * 3/1999 Kamoi ................ B41J 2/14233
347/50
8,262,202 B2 9/2012 Morozumi et al.
(Continued)

*Primary Examiner* — Geoffrey Mruk

(74) *Attorney, Agent, or Firm* — Rabin & Berdo, P.C.

(57) ABSTRACT

An inkjet head includes a substrate that defines a cavity in which ink is stored, a vibrating membrane that is supported by the substrate and that defines the cavity, and a piezoelectric device that is disposed on the vibrating membrane and that changes a volume of the cavity by displacing the vibrating membrane. A driving IC is mounted on the actuator substrate and drives the piezoelectric device.

6 Claims, 15 Drawing Sheets

Related U.S. Application Data continuation of application No. 14/810,078, filed on Jul. 27, 2015, now Pat. No. 9,427,967.

(51) Int. Cl.
*H01L 41/187* (2006.01)
*B41J 2/16* (2006.01)

(56) References Cited

U.S. PATENT DOCUMENTS

| | | | |
|---|---|---|---|
| 2004/0233255 A1* | 11/2004 | Parish | B41J 2/04541 347/63 |
| 2012/0182360 A1 | 7/2012 | Ito et al. | |
| 2013/0265370 A1 | 10/2013 | Nagahata | |

* cited by examiner

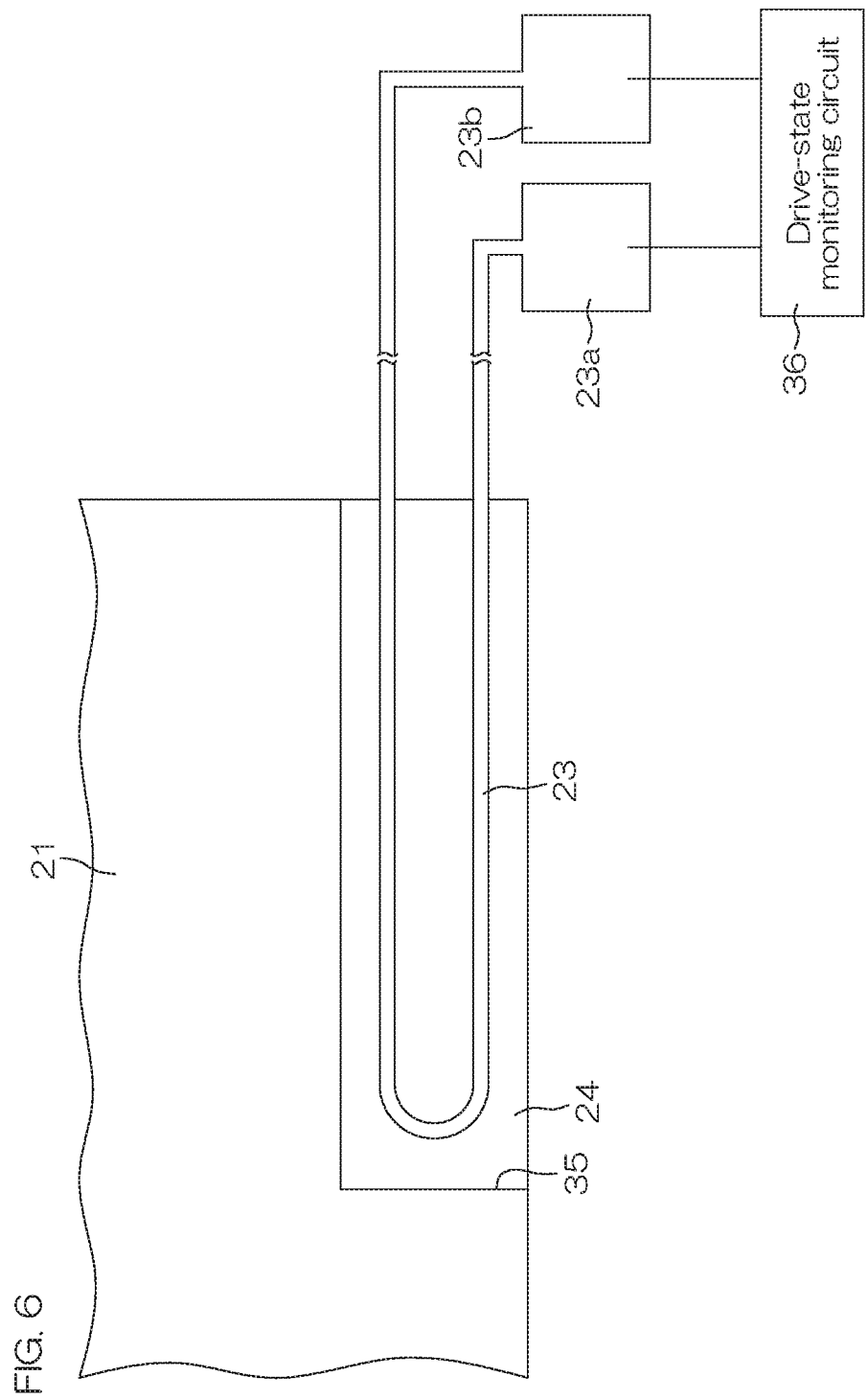

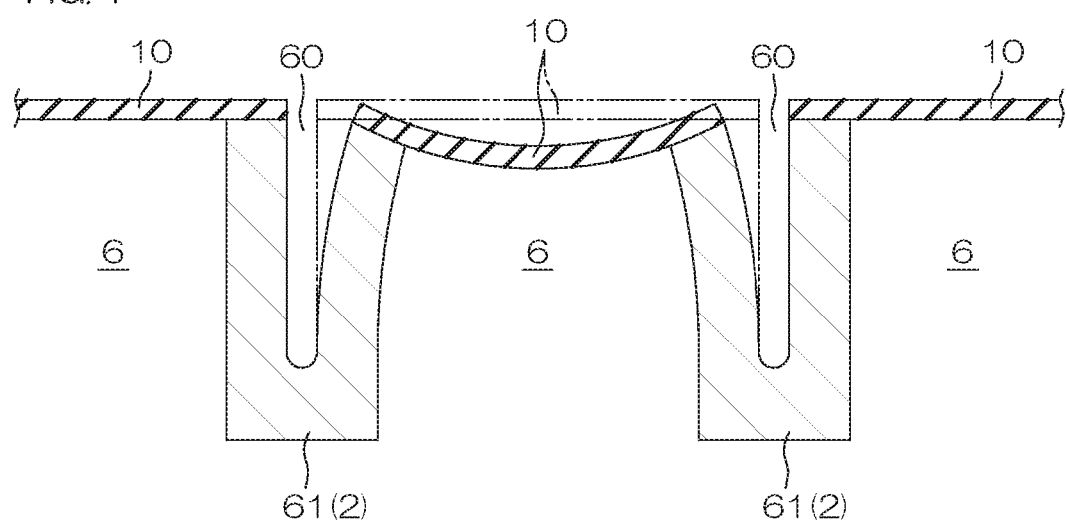

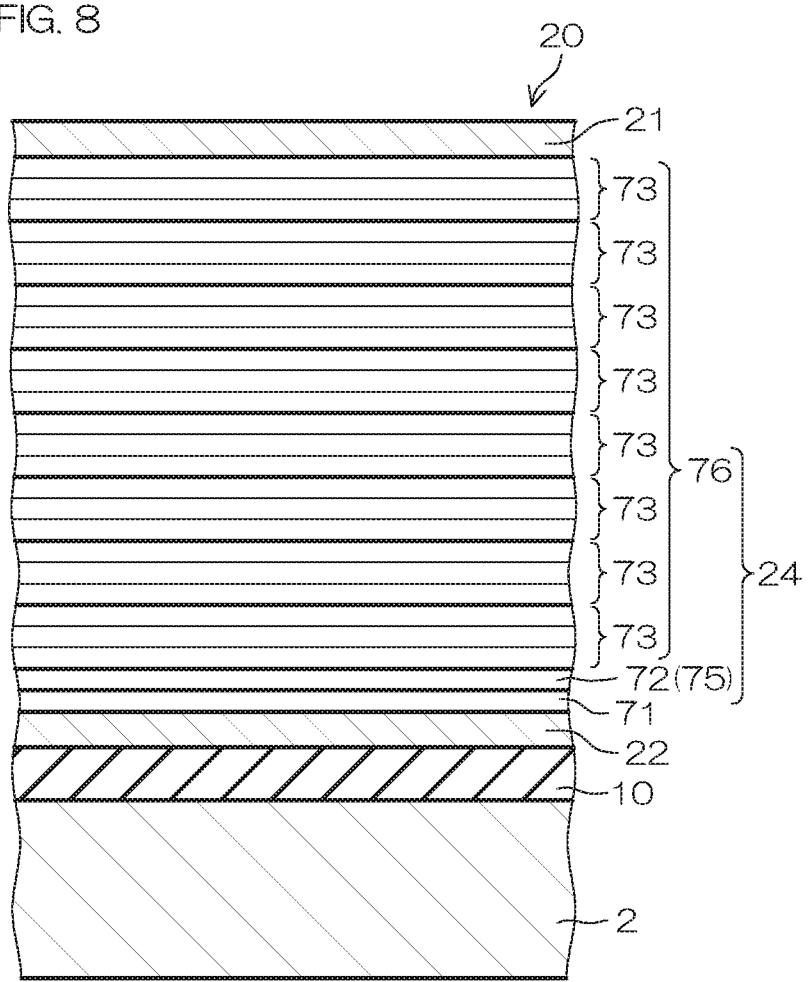

INKJET HEAD

CROSS-REFERENCE TO RELATED APPLICATIONS

This application is a continuation of U.S. application Ser. No. 15/227,956, filed on Aug. 3, 2016, which is a continuation of U.S. application Ser. No. 14/810,078, filed on Jul. 27, 2015 (now U.S. Pat. No. 9,427,967, issued on Aug. 30, 2016). Further, this application claims the benefit of priority of Japanese application serial numbers 2015-139079, filed on Jul. 10, 2015, 2014-179167, filed on Sep. 3, 2014, 2014-179163, filed on Sep. 3, 2014, and 2014-153165, filed on Jul. 28, 2014. The disclosures of these prior US and Japanese applications are incorporated herein by reference.

1. FIELD OF THE INVENTION

The present invention relates to a piezoelectric membrane, a piezoelectric device provided with a piezoelectric membrane, and an inkjet head provided with a piezoelectric device. The piezoelectric device can be a piezoelectric actuator or can be a piezoelectric sensor.

2. DESCRIPTION OF THE RELATED ART

An example of an inkjet head provided with a piezoelectric device is disclosed in US2013/0265370A1. The inkjet head of US2013/0265370A1 includes a silicon substrate having a cavity (a pressure chamber) defined as an ink reservoir, a vibrating membrane that defines a ceiling wall of the cavity, and a piezoelectric device disposed on the surface of the vibrating membrane. The piezoelectric device includes a lower electrode, an upper electrode, and a piezoelectric membrane placed between these electrodes. When a driving voltage is applied between the upper and lower electrodes, the piezoelectric membrane is deformed by the inverse piezoelectric effect, and, accordingly, the vibrating membrane is deformed together with the piezoelectric device. The deformation of the vibrating membrane brings about a change in volume of the cavity, and, as a result, ink in the cavity is pressed and discharged therefrom.

The lower electrode, the upper electrode, and the piezoelectric membrane are each formed in a substantially rectangular shape in the cavity, and are each formed so as to have substantially uniform film thickness. A PZT (lead zirconate titanate) membrane formed by a sol-gel method or by a sputtering method is used as the piezoelectric membrane.

In a cross section that traverses the cavity, the side wall of the cavity and the undersurface of the vibrating membrane show straight lines, respectively, and these straight lines make an angle with each other. In other words, the side wall of the cavity and the undersurface of the vibrating membrane are planes, respectively, and a corner portion is formed at an intersection between these planes.

SUMMARY OF THE INVENTION

A preferred embodiment of the present invention provides a piezoelectric membrane that is excellent in orientation and in breakdown voltage.

A preferred embodiment of the present invention provides a piezoelectric device including a piezoelectric membrane that is excellent in orientation and in breakdown voltage.

A preferred embodiment of the present invention provides an inkjet head that includes a piezoelectric device including a piezoelectric membrane that is excellent in orientation and in breakdown voltage.

A preferred embodiment of the present invention provides a piezoelectric membrane that includes a columnar structure layer and an amorphous structure layer of a piezoelectric material, the amorphous structure layer being stacked contiguously with the columnar structure layer.

Additionally, a preferred embodiment of the present invention provides a piezoelectric device that includes a lower electrode, a piezoelectric membrane that is disposed on the lower electrode and that has the aforementioned features, and an upper electrode that is disposed on the piezoelectric membrane and that faces the lower electrode with the piezoelectric membrane interposed between the upper electrode and the lower electrode.

Additionally, a preferred embodiment of the present invention provides an inkjet head that includes a substrate that defines a cavity in which ink is stored, a vibrating membrane that is supported by the substrate and that defines the cavity, and the aforementioned piezoelectric device that is disposed on the vibrating membrane and that changes a volume of the cavity by displacing the vibrating membrane.

The aforementioned or other objects, features, and effects of the present invention will be clarified by the following description of preferred embodiments with reference to the accompanying drawings.

BRIEF DESCRIPTION OF THE DRAWINGS

FIG. 6 is an enlarged plan view showing an arrangement example of a performance monitoring electrode included in a piezoelectric device that drives the inkjet head.

FIG. 7 is a pictorial cross-sectional view to describe an operation state of the inkjet head.

FIG. 8 is a schematic cross-sectional view showing an arrangement example of a piezoelectric membrane included in the piezoelectric device.

DETAILED DESCRIPTION OF THE PREFERRED EMBODIMENTS

Figure 1:
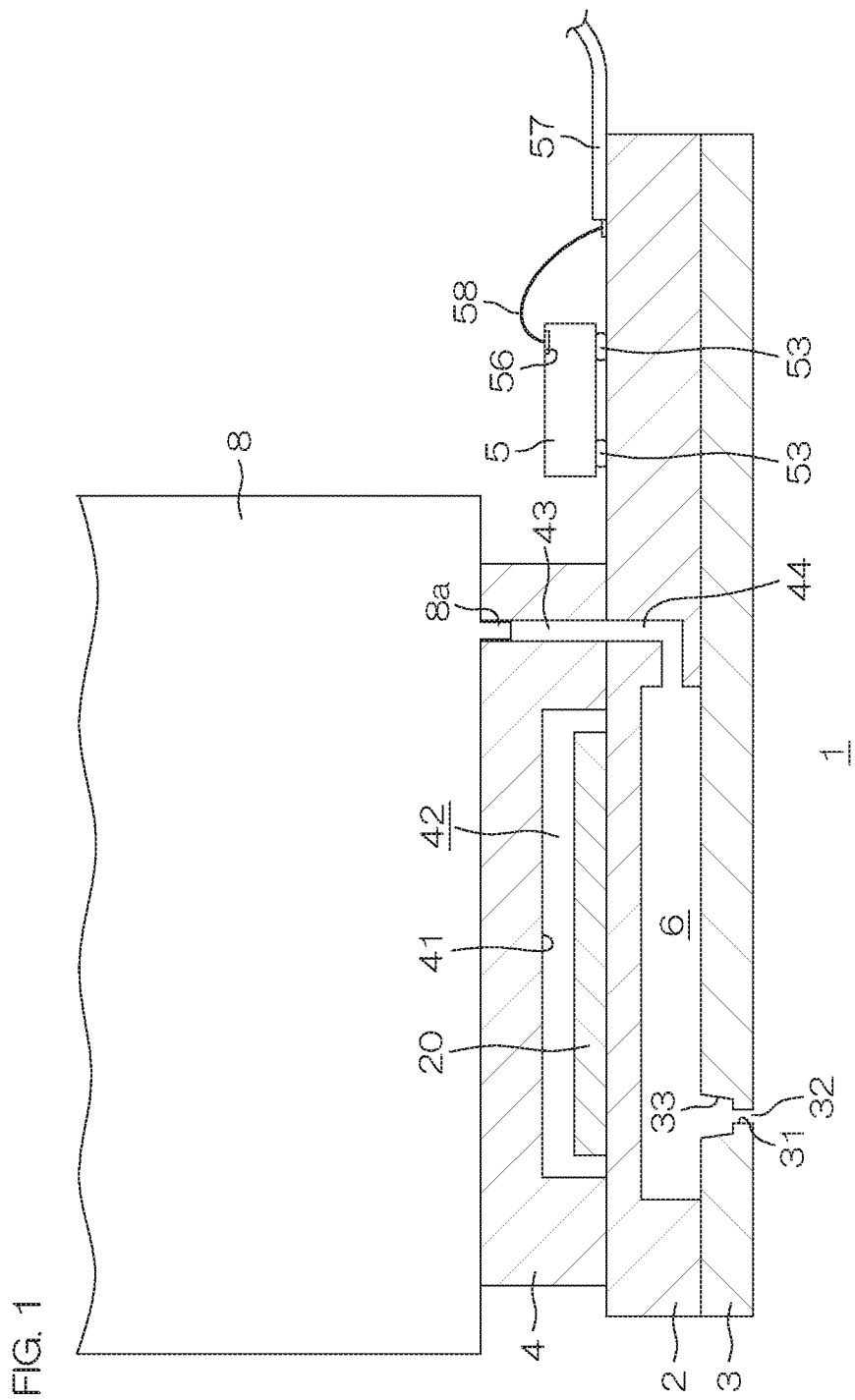
FIG. 1 is a pictorial cross-sectional view to describe an arrangement of an inkjet head according to a preferred embodiment of the present invention.

A preferred embodiment of the present invention provides a piezoelectric membrane that includes a columnar structure layer and an amorphous structure layer that is made of a piezoelectric material and that is stacked on the columnar structure layer contiguously therewith.

The columnar structure layer has uniformly-oriented crystals. The amorphous structure layer has fine film quality and is excellent in breakdown voltage. The amorphous structure layer is stacked on the columnar structure layer contiguously therewith, and hence follows the orientation of the columnar structure layer. Therefore, the piezoelectric membrane including the columnar structure layer and the amorphous structure layer that are stacked on each other is excellent both in orientation and in breakdown voltage.

In one preferred embodiment of the present invention, the columnar structure layer has a <100> orientation or a <111> orientation. When the columnar structure layer has the <100> orientation, the amorphous structure layer is also a layer that is greatly apt to have this orientation. In this case, the piezoelectric membrane has the property of having a great displacement resulting from the inverse piezoelectric effect when a voltage is applied and the property of having a great electromotive force resulting from the piezoelectric effect when it is deformed. On the other hand, when the columnar structure layer has the <111> orientation, the amorphous structure layer is also a layer that is greatly apt to have this orientation. In this case, the piezoelectric membrane has the property of easily controlling the magnitude of a displacement resulting from the inverse piezoelectric effect when a voltage is applied and the property of having a stable electromotive force resulting from the piezoelectric effect when it is deformed.

It is possible to deposit a columnar structure layer by, for example, a sputtering method, and, as a result, it is possible to form a columnar structure layer having high orientation controllability.

In one preferred embodiment of the present invention, the columnar structure layer is a layer formed by depositing a piezoelectric material in a polarized state. It is possible to form a columnar structure layer having high orientation controllability by depositing a piezoelectric material in a polarized state. More specifically, it is possible to form a columnar structure layer by depositing a piezoelectric material according to the sputtering method in a state in which an electric field is being applied.

It is possible to form an amorphous structure layer by, for example, a sol-gel method, and, as a result, it is possible to form an amorphous structure layer that is fine and that has high breakdown voltage.

In one preferred embodiment of the present invention, the columnar structure layer and the amorphous structure layer are layers made of the same piezoelectric material in kind. It is possible to more strictly control the orientation of the amorphous structure layer by making the columnar structure layer and the amorphous structure layer by use of the same piezoelectric material in kind, and therefore it is possible to provide a piezoelectric membrane that is excellent in orientation and in breakdown voltage.

One preferred embodiment of the present invention provides a piezoelectric device that includes a lower electrode, a piezoelectric membrane that is disposed on the lower electrode and that is characterized as mentioned above, and an upper electrode that is disposed on the piezoelectric membrane and that faces the lower electrode with the piezoelectric membrane between the upper and lower electrodes.

According to this arrangement, it is possible to provide a piezoelectric device arranged so as to place a piezoelectric membrane, which is excellent in orientation and in breakdown voltage, between an upper electrode and a lower electrode. A driving voltage is applied between the upper electrode and the lower electrode, thus making it possible to deform the piezoelectric membrane by the inverse piezoelectric effect. Additionally, when the piezoelectric membrane is deformed by an external force, the piezoelectric membrane can generate a voltage between the upper electrode and the lower electrode by the piezoelectric effect. It is possible to realize a piezoelectric actuator or a piezoelectric sensor that has excellent properties by controlling the orientation of the columnar structure layer in accordance with desired properties. For example, when the columnar structure layer has the <100> orientation, the piezoelectric membrane has the property of having a great displacement resulting from the inverse piezoelectric effect when a voltage is applied and the property of having a great electromotive force resulting from the piezoelectric effect when it is deformed. Therefore, it is possible to realize a piezoelectric actuator that is excellent in driving performance or a piezoelectric sensor that is high in sensitivity. On the other hand, when the columnar structure layer has the <111> orientation, the piezoelectric membrane has the property of easily controlling the magnitude of a displacement resulting from the inverse piezoelectric effect when a voltage is applied and the property of having a stable electromotive force resulting from the piezoelectric effect when it is deformed. Therefore, it is possible to realize a piezoelectric actuator that is excellent in controllability or a piezoelectric sensor that performs stable outputting.

One preferred embodiment of the present invention provides an inkjet head that includes a substrate that defines a cavity in which ink is stored, a vibrating membrane that is supported by the substrate and that defines the cavity, and the piezoelectric device that is disposed on the vibrating membrane and that changes the volume of the cavity by displacing the vibrating membrane.

According to this arrangement, it is possible to provide an inkjet head driven by a piezoelectric device that has a piezoelectric membrane that is excellent in orientation and in breakdown voltage. It is possible to realize an inkjet head that has excellent properties by controlling the orientation of the columnar structure layer in accordance with desired properties. For example, when the columnar structure layer has the <100> orientation, the piezoelectric membrane has a great displacement resulting from the inverse piezoelectric effect when a voltage is applied. Therefore, it is possible to provide an inkjet head that is excellent in driving performance. On the other hand, when the columnar structure layer has the <111> orientation, the piezoelectric membrane easily controls the magnitude of a displacement caused by the inverse piezoelectric effect when a voltage is applied. Therefore, it is possible to provide an inkjet head that is excellent in controllability.

Preferred embodiments of the present invention will be hereinafter described in detail with reference to the accompanying drawings.

Figure 2:
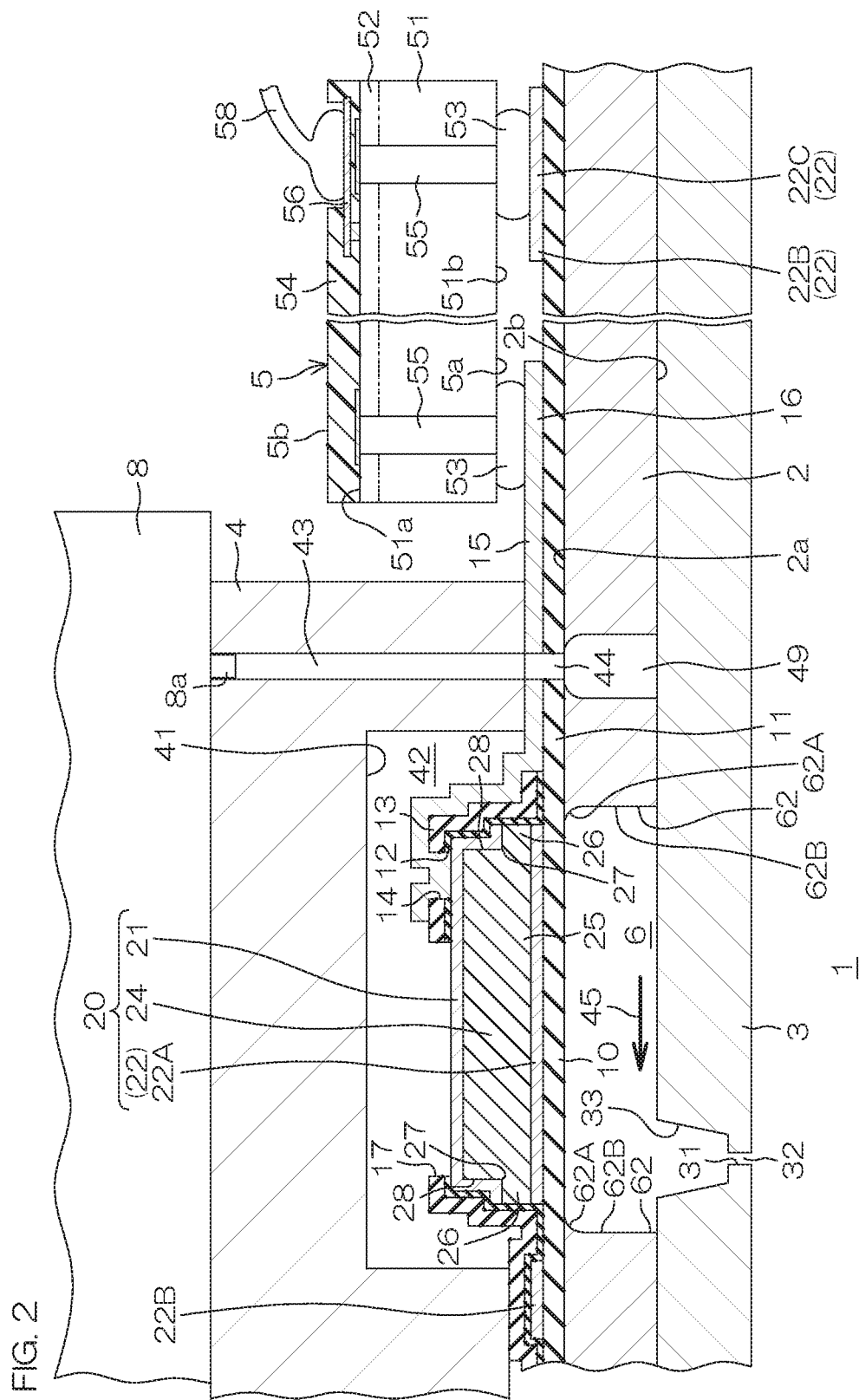
FIG. 2 is an enlarged cross-sectional view (cross-sectional view taken along line II-II in FIG. 3) showing an arrangement of a main part of the inkjet head.

FIG. 1 is a pictorial cross-sectional view to describe an arrangement of an inkjet head 1 according to a preferred embodiment of the present invention. FIG. 2 is an enlarged cross-sectional view showing an arrangement of a main part of the inkjet head 1.

The inkjet head 1 includes an actuator substrate 2, a nozzle substrate 3, a protective substrate 4, and a driving IC 5.

The actuator substrate 2 is made of, for example, a silicon substrate, and defines a plurality of cavities 6. The cavities 6 are arranged in, for example, a direction perpendicular to each sheet of FIGS. 1 and 2. The actuator substrate 2 supports a vibrating membrane 10 at its front surface 2a. The vibrating membrane 10 serves as a ceiling wall of the cavity 6, and defines the cavity 6. A piezoelectric device 20 is disposed on the vibrating membrane 10.

The nozzle substrate 3 is joined to a back surface 2b of the actuator substrate 2. The nozzle substrate 3 is made of, for example, a silicon substrate, and is bonded to the back surface 2b of the actuator substrate 2, and defines the cavities 6 along with both the actuator substrate 2 and the vibrating membrane 10. The nozzle substrate 3 has a recess portion 33 facing the cavity 6, and an ink discharge passage 31 is formed in a bottom surface of the recess portion 33. The ink discharge passage 31 passes through the nozzle substrate 3, and has a discharge port 32 on the side opposite to the cavity 6. Therefore, when the cavity 6 changes in volume, ink stored in the cavity 6 flows through the ink discharge passage 31, and is discharged from the discharge port 32.

The protective substrate 4 is made of, for example, a silicon substrate. The protective substrate 4 is disposed so as to cover the piezoelectric device 20, and is joined to the front surface 2a of the actuator substrate 2. The protective substrate 4 has a housing hollow portion 42 at an opposite surface 41 that faces the obverse surface 2a of the actuator substrate 2. A plurality of piezoelectric devices 20 that correspond to the plurality of cavities 6, respectively, are housed in the housing hollow portion 42.

The driving IC 5 is mounted on the front surface 2a of the actuator substrate 2. A wire 15 by which the piezoelectric device 20 and the driving IC 5 are connected together is formed on the actuator substrate 2. The wire 15 is drawn out of the protective substrate 4. The driving IC 5 is joined onto a land 16 of the wire 15, and, accordingly, the driving IC 5 is mounted on the actuator substrate 2.

The driving IC 5 is a semiconductor integrated circuit, and may have the form of, for example, a chip size package. More specifically, the driving IC 5 includes a semiconductor substrate 51, an active region 52 disposed on the side of the front surface 51a of the semiconductor substrate 51, and a bump 53 that serves as an output terminal and that is disposed on a back surface 51b of the semiconductor substrate 51. A transistor and other semiconductor devices are formed in the active region 52. A protective resin layer 54 and the like are disposed on the surface of the semiconductor substrate 51 so as to protect the active region 52. A through via 55 is formed in the semiconductor substrate 51. The through via 55 may be made of TSV (Through-Silicon Via). The through via 55 connects the active region 52 and the bump 53 together, and draws out an output terminal of an electronic circuit formed in the active region 52 to the back surface 51b of the semiconductor substrate 51. The back surface 51b of the semiconductor substrate 51 is a first surface 5a of the driving IC 5. This first surface 5a faces the actuator substrate 2, and a plurality of bumps 53 which serve as output terminals of the driving IC 5 are disposed in a concentrated manner. The number of the bumps 53 is substantially equivalent to the number of the piezoelectric devices 20 disposed on the actuator substrate 2. For example, if about three hundred piezoelectric devices 20 are disposed on the actuator substrate 2, the number of the bumps 53 serving as the output terminals is about three hundred. These bumps 53 are joined onto the land 16 of the wire 15 corresponding to the plurality of piezoelectric devices 20. As a result, the electric connection between the driving IC 5 and the piezoelectric device 20 is achieved without using wire bonding or without using an FPC (flexible print-circuit board).

Input terminals 56 connected to the active region 52 are disposed in a concentrated manner on a second surface 5b of the driving IC 5 positioned on the side of the active region 52 of the semiconductor substrate 51. The input terminal 56 may have the form of a pad exposed from the protective resin layer 54. On the other hand, one end of the FPC 57 is fixed to the actuator substrate 2 near the driving IC 5. The input terminals 56 are connected to a plurality of core wires of the FPC 57, respectively, through a bonding wire 58. The number of the input terminals 56 is, for example, about twenty, and, accordingly, the number of the core wires of the FPC 57 is also about twenty. The FPC 57 is connected to, for example, a control IC (not shown).

An ink tank 8 that is storing ink is disposed on the protective substrate 4. An ink supply passage 43 is formed so as to pass through the protective substrate 4. An ink supply port 8a of the ink tank 8 is united with the ink supply passage 43. The ink supply passage 43 of the protective substrate 4 leads to an ink supply passage 44 formed in the actuator substrate 2. The ink supply passage 44 leads to the cavity 6. Therefore, ink stored in the ink tank 8 that is an ink supply source is supplied to the cavity 6 through the ink supply passages 43 and 44.

Figure 3:
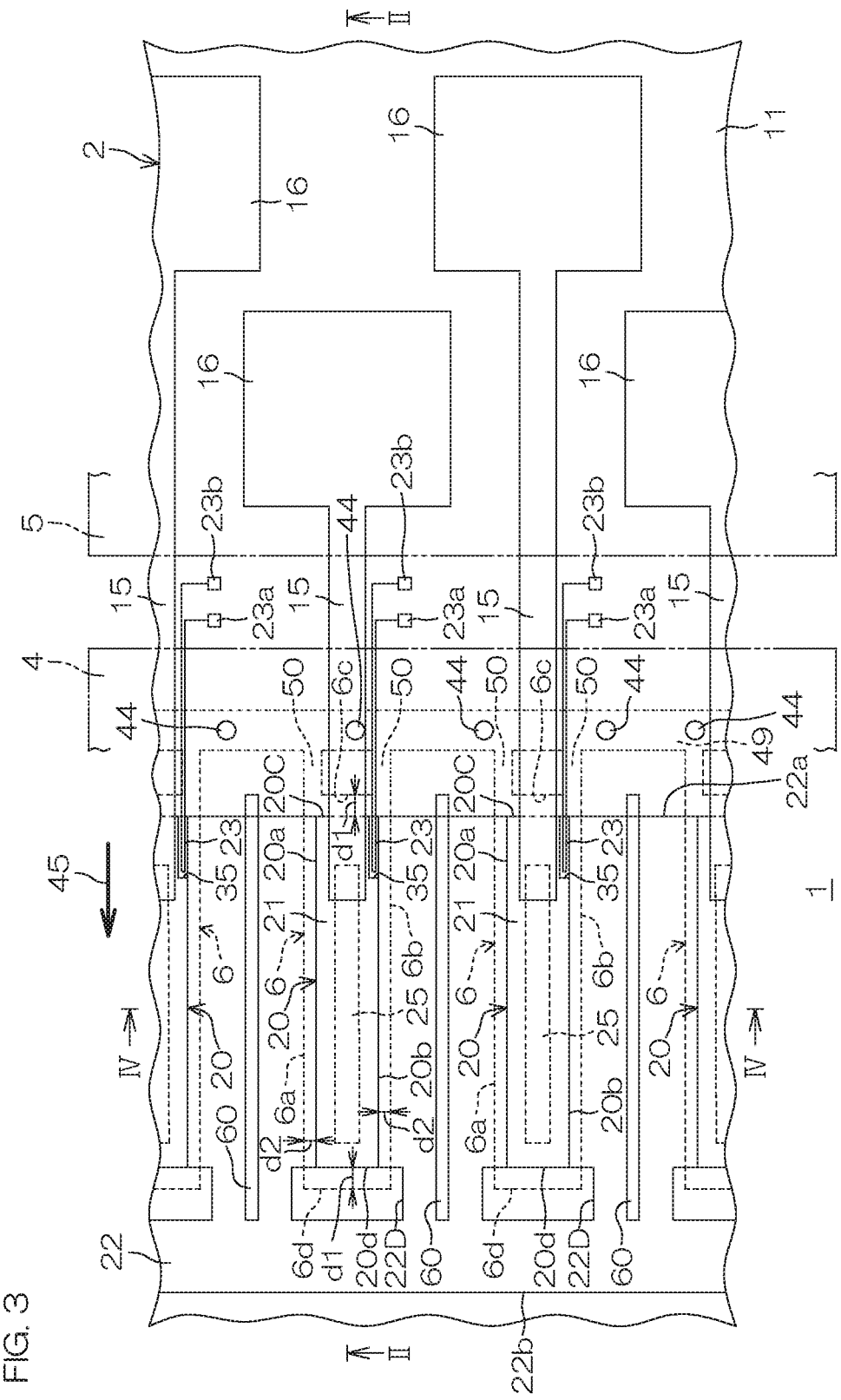
FIG. 3 is a schematic plan view of the inkjet head.
Figure 4:
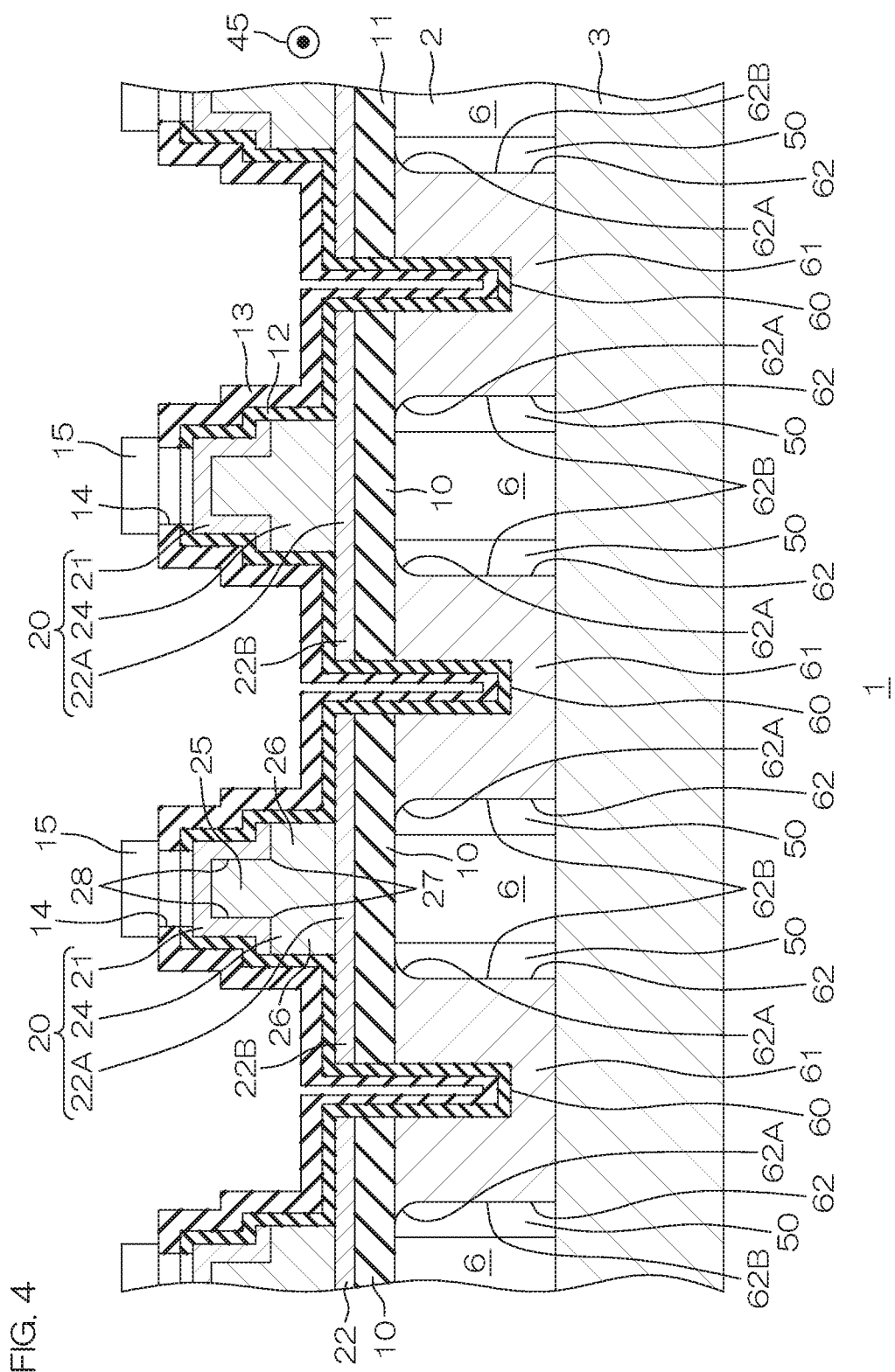
FIG. 4 is a schematic enlarged cross-sectional view taken along line IV-IV in FIG. 3.
Figure 5:
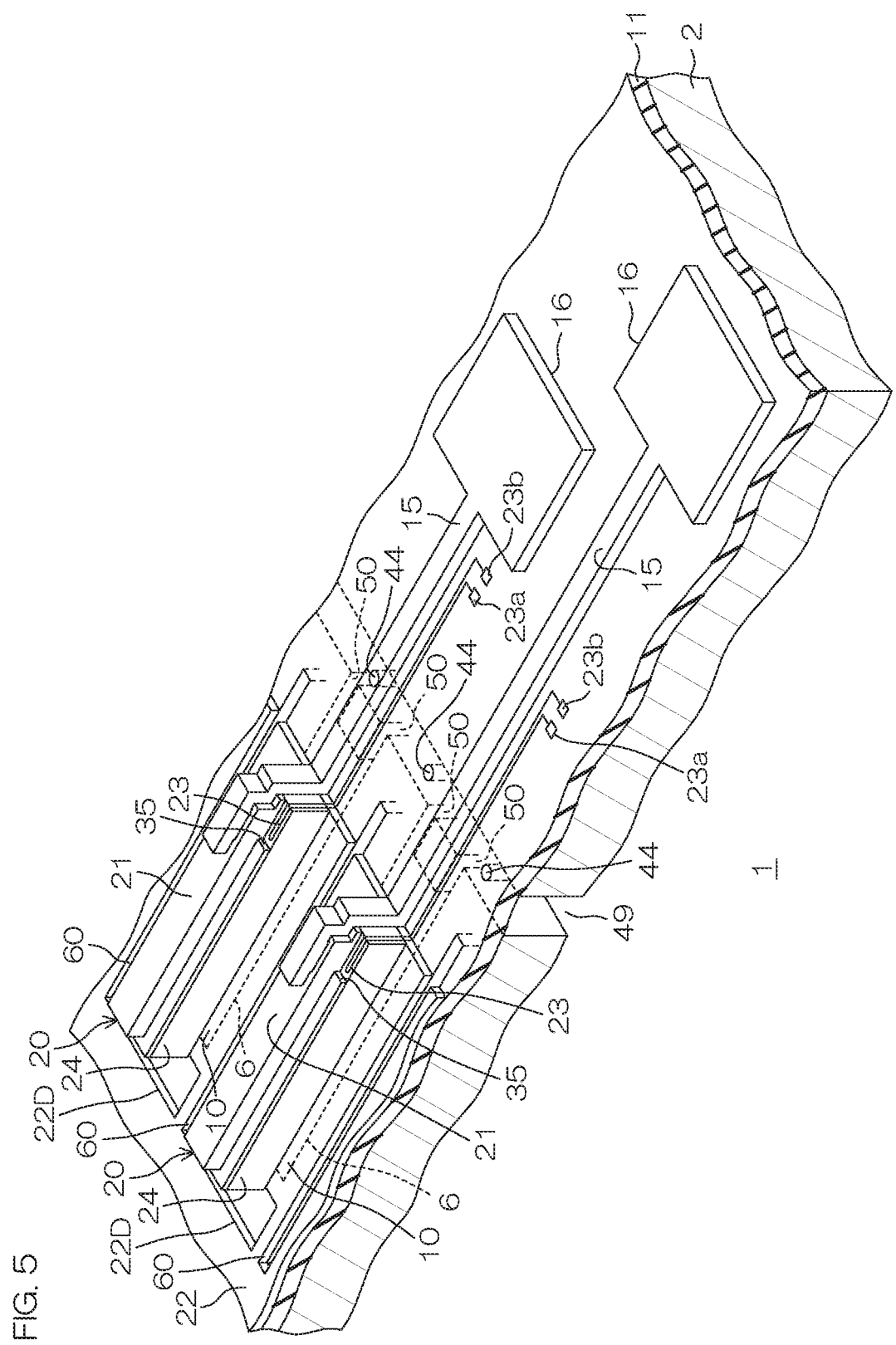
FIG. 5 is a schematic perspective view of the inkjet head.

FIG. 3 is a schematic plan view of the inkjet head (particularly, the actuator substrate 2). FIG. 4 is a schematic enlarged cross-sectional view taken along line IV-IV in FIG. 3. FIG. 5 is a schematic perspective view of the inkjet head 1 (particularly, the actuator substrate 2). FIG. 2 mentioned above is a cross-sectional view taken along line II-II in FIG. 3.

A vibrating membrane formation layer 11 is formed on the front surface 2a of the actuator substrate 2. In the vibrating membrane formation layer 11, a part that forms the bottom wall of the cavity 6, i.e., a part that defines the cavity 6 is the vibrating membrane 10.

The cavity 6 is formed so as to pass through the actuator substrate 2 in the present preferred embodiment. An ink passage 50 that leads to the cavity 6 is additionally formed in the actuator substrate 2. The ink passage 50 leads to the cavity 6, and is formed so as to guide ink, which is supplied from the ink tank 8 through the ink supply passage 43 of the protective substrate 4 and through the ink supply passage 44 of the actuator substrate 2, to the cavity 6. Ink that has been introduced from the ink passage 50 into the cavity 6 moves along an ink flow direction 45 parallel to the longitudinal direction of the cavity 6, and reaches the ink discharge passage 31.

The cavities 6 are formed in the actuator substrate 2 so as to extend in parallel with each other in a stripe manner. The cavities 6 are evenly spaced with slight intervals (for example, about 30 μm to 350 μm) therebetween in their width directions. Each cavity 6 has a rectangular shape that slenderly extends along the ink flow direction 45 from the ink passage 50 toward the ink discharge passage 31 when viewed in plan. The top surface portion of the cavity 6 has two side edges 6a and 6b along the ink flow direction 45 and two end edges 6c and 6d along a direction perpendicular to the ink flow direction 45. The ink passage 50 is divided into two passages at one end of the cavity 6, and leads to a common ink passage 49. The common ink passage 49 leads to an ink passage 50 corresponding to the plurality of cavities 6. The ink supply passage 44 through which ink is discharged from the ink tank 8 is guided leads to the common ink passage 49. As shown in FIG. 3 and FIG. 5, the plurality of ink supply passages 44 are arranged with intervals therebetween along the common ink passage 49. The ink supply passage 44 is formed so as to pass through the vibrating membrane 10 (in addition, the wire 15 at a place where the wire 15 is disposed) and so as to further pass through the actuator substrate 2 to the common ink passage 49.

Each cavity 6 is defined by the vibrating membrane 10, the actuator substrate 2, and the nozzle substrate 3, and is formed in a substantially rectangular parallelepiped shape in the present preferred embodiment. For example, the length of the cavity 6 may be about 800 µm, and the width of the cavity 6 may be about 55 µm. The ink passage 50 is formed so as to lead to one end in the longitudinal direction of the cavity 6 (in the present preferred embodiment, an end positioned on the side opposite to the discharge port 32). In the present preferred embodiment, the discharge port 32 of the nozzle substrate 3 is disposed near the opposite end in the longitudinal direction of the cavity 6.

The vibrating membrane 10 may be a single film of a silicon oxide film, or may be a laminated film in which a silicon nitride film is stacked on a silicon oxide film. The cavity 6 is not necessarily required to pass through the actuator substrate 2, and may be a hollow portion formed by digging from the lower surface side so as to leave a part of the side of the piezoelectric device 20. In this case, the remainder of the actuator substrate 2 forms a part of the vibrating membrane 10. In this specification, the vibrating membrane 10 denotes a ceiling wall portion defining the cavity 6 in the vibrating membrane formation layer 11.

The thickness of the vibrating membrane 10 is, for example, 0.4 µm to 2 µm. If the vibrating membrane 10 is made of a silicon oxide film, the thickness of the silicon oxide film may be about 1.2 µm. If the vibrating membrane 10 is made of a laminated structure consisting of a silicon layer, a silicon oxide layer, and a silicon nitride layer, the thickness of the silicon layer, the thickness of the silicon oxide layer, and the thickness of the silicon nitride layer may be each about 0.4 µm.

The piezoelectric device 20 is disposed on the vibrating membrane 10. A piezoelectric actuator (one example of piezoelectric equipment) is composed of the vibrating membrane 10 and the piezoelectric device 20. The piezoelectric device 20 includes a lower electrode 22 formed on the vibrating membrane formation layer 11, a piezoelectric membrane 24 formed on the lower electrode 22, and an upper electrode 21 formed on the piezoelectric membrane 24. In other words, the piezoelectric device 20 is formed by sandwiching the piezoelectric membrane 24 between the upper electrode 21 and the lower electrode 22.

The lower electrode 22 may have a two-layer structure in which, for example, a Ti (titanium) layer and a Pt (platinum) layer are stacked together in this order from the side of the vibrating membrane 10. Besides this, the lower electrode 22 can be made of a single film, such as an Au (gold) film, a Cr (chrome) layer, or an Ni (nickel) layer. The lower electrode 22 has a main electrode portion 22A being in contact with the undersurface of the piezoelectric membrane 24 and an extension portion 22B that extends to a region outside the piezoelectric membrane 24 (see FIG. 4).

For example, a PZT ($PbZr_xTi_{1-x}O_3$: lead zirconate titanate) film formed by the sol-gel method or by the sputtering method can be used as the piezoelectric membrane 24. This piezoelectric membrane 24 is formed of a sintered object made of metallic oxide crystals. Preferably, the thickness of the piezoelectric membrane 24 is 1 µm to 5 µm. Preferably, the entire thickness of the vibrating membrane 10 is roughly equal to the thickness of the piezoelectric membrane 24 or is about ⅔ of the thickness of the piezoelectric membrane 24.

The upper electrode 21 is formed so as to have substantially the same shape as the piezoelectric membrane 24 when viewed in plan. The upper electrode 21 may have a laminated structure in which, for example, a conductive oxide film (e.g., $IrO_2$ (iridium oxide) film) and a metal film (e.g., Ir (iridium) film) are stacked together.

The surface of the vibrating membrane formation layer 11, the surface of the piezoelectric device 20, and the surface of the extension portion 22B of the lower electrode 22 are covered with a hydrogen barrier film 12. The hydrogen barrier film 12 is made of, for example, $Al_2O_3$ (alumina). This makes it possible to prevent a deterioration in properties of the piezoelectric membrane 24 caused by a hydrogen reduction. An insulating film 13 is stacked on the hydrogen barrier film 12. The insulating film 13 is made of, for example, $SiO_2$. The wire 15 is formed on the insulating film 13. The wire 15 may be made of a metallic material that includes Al (aluminum).

One end of the wire 15 is disposed above one end of the upper electrode 21. A through hole (contact hole) 14 that continuously passes through the hydrogen barrier film 12 and through the insulating film 13 is formed between the wire 15 and the upper electrode 21. One end of the wire 15 enters the through hole 14, and is connected to the upper electrode 21 in the through hole 14. The wire 15 has its one end that is connected to one end of the upper electrode 21 (i.e., end closer to one end edge of the piezoelectric device 20) and that is drawn out so as to extend in a direction opposite to the ink flow direction when viewed in plan. The land 16 is disposed at the forward end of the wire 15 and is united with the wire 15. An opening 17 (see FIG. 2) is formed in the hydrogen barrier film 12 and in the insulating film 13 in a region corresponding to the middle of the surface of the upper electrode 21 (i.e., a part surrounded by the peripheral edge of the surface of the upper electrode 21). This opening 17 is a rectangle that is long in the longitudinal direction of the upper electrode 21.

As shown in FIG. 2, the extension portion 22B of the lower electrode 22 is drawn around on the actuator substrate 2, and reaches a mounting region in which the driving IC 5 is mounted. A land 22C that is used to connect the lower electrode 22 to the outside is disposed in this mounting region. The bump 53 of the driving IC 5 is joined to the land 22C. The connection between the lower electrode 22 and the driving IC 5 is achieved in this way.

The piezoelectric device 20 is formed at a place facing the cavity 6 with the vibrating membrane 10 positioned between the piezoelectric device 20 and the cavity 6. In other words, the piezoelectric device 20 is formed so as to come into contact with a surface of the vibrating membrane 10 on the side opposite to the cavity 6. The vibrating membrane formation layer 11 is formed on the actuator substrate 2, and the vibrating membrane 10 is supported by a part around the cavity 6 in the vibrating membrane formation layer 11. The vibrating membrane 10 is supported by the actuator substrate 2 in this way. The vibrating membrane 10 has flexibility that is deformable in a direction facing the cavity 6 (i.e., in the thickness direction of the vibrating membrane 10).

The driving IC 5 is connected to each upper electrode 21 of the piezoelectric devices 20 through the bump 53 and the wire 15, and is connected to the lower electrode 22 which is shared among the piezoelectric devices 20, through another bump 53. This makes it possible for the driving IC 5 to apply a driving voltage between the upper electrode 21 and the lower electrode 22 of each piezoelectric device 20. The piezoelectric membrane 24 is deformed by the inverse piezoelectric effect when a driving voltage is applied from the driving IC 5 to the piezoelectric device 20. As a result, the vibrating membrane 10 is deformed together with the piezoelectric device 20, and therefore the cavity 6 changes in volume, and ink in the cavity 6 is pressed. Pressed ink flows through the ink discharge passage 31, and is discharged from the discharge port 32 in the form of micro liquid droplets.

The piezoelectric device 20 is formed such that its length in the ink flow direction 45 (the same direction as the longitudinal direction of the vibrating membrane 10) is shorter than the length in the longitudinal direction of the vibrating membrane 10, and the piezoelectric device 20 has a rectangular shape when viewed in plan. As shown in FIG. 3, both end edges 20*d* and 20*c* in the longitudinal direction of the piezoelectric device 20 are disposed on the inner side with a predetermined distance d1 (e.g., 5 μm) with respect to the corresponding end edges of the vibrating membrane 10 (which coincide with both end edges 6*c* and 6*d* of the cavity 6 when viewed in plan). Additionally, the piezoelectric device 20 is formed such that its width in the lateral direction perpendicular to the longitudinal direction of the vibrating membrane 10 (a direction parallel to the principal plane of the actuator substrate 2) is narrower than the width in the lateral direction of the vibrating membrane 10 (i.e., the top surface portion of the cavity 6). Both side edges 20*a* and 20*b* in the longitudinal direction of the piezoelectric device 20 are disposed on the inner side with a predetermined distance d2 (e.g., 5 μm) with respect to the corresponding side edges of the vibrating membrane 10 (which coincide with both side edges 6*a* and 6*b* of the cavity 6 when viewed in plan).

As shown in FIG. 3, the lower electrode 22 has a predetermined width in the ink flow direction 45 when viewed in plan, and extends in a direction perpendicular to the ink flow direction 45 while straddling the plurality of cavities 6, and is a common electrode shared among the piezoelectric devices 20. A first side 22*a* along a direction perpendicular to the ink flow direction 45 of the lower electrode 22 matches with a line that connects one-side end edges of the piezoelectric devices 20 together when viewed in plan. A second side 22*b* facing the first side 22*a* of the lower electrode 22 is disposed outside an end edge 6*d* (i.e., end edge of the vibrating membrane 10) of the cavity 6 corresponding to opposite-side end edges of the piezoelectric devices 20 (on the downstream side of the ink flow direction 45).

The lower electrode 22 includes a main electrode portion 22A that is a component of the piezoelectric device 20 and that is rectangular when viewed in plan and an extension portion 22B that is drawn out from the main electrode portion 22A in a direction along the surface of the vibrating membrane formation layer 11 and that extends outwardly from the peripheral edge of the top surface portion of the cavity 6 while straddling the peripheral edge of the top surface portion (the vibrating membrane 10) of the cavity 6. The shape, the size, and the disposition of the main electrode portion 22A are the same as the piezoelectric device 20 when viewed in plan.

The extension portion 22B straddles a corresponding side edge of the top surface portion of the cavity 6 from each side edge of the main electrode portion 22A, and extends outwardly from the side edge of the top surface portion of the cavity 6 when viewed in plan. The extension portion 22B is an area exclusive of the main electrode portion 22A in the entire region of the lower electrode 22. The extension portion 22B has excision portions 22D each of which is rectangular when viewed in plan and each of which is formed so as to pass through the lower electrode 22 on the downstream side in the ink flow direction 45 of each piezoelectric device 20. Each excision portion 22D has two side edges (short sides) along the ink flow direction 45 and two end edges (long sides) along a direction perpendicular to the ink flow direction when viewed in plan. One end edge of the excision portion 22D is disposed at a position at which it matches with the end edge of the piezoelectric device 20 (i.e., end edge on the downstream side of the main electrode portion 22A) with respect to the ink flow direction, whereas the other end edge of the excision portion 22D is disposed outside the end edge of the vibrating membrane 10 (i.e., on the downstream side in the ink flow direction 45). One side edge of the excision portion 22D is disposed outside one side edge of the vibrating membrane 10, whereas the other side edge of the excision portion 22D is disposed outside the other side edge of the vibrating membrane 10. Therefore, an end on the end edge side of the vibrating membrane 10 is disposed inside the excision portion 22D when viewed in plan.

The upper electrode 21 is formed in a rectangular shape having the same pattern as the main electrode portion 22A of the lower electrode 22 when viewed in plan. In other words, the shape, the size, and the disposition of the upper electrode 21 are the same as the piezoelectric device 20 when viewed in plan.

The piezoelectric membrane 24 is formed in a rectangular shape having the same pattern as the upper electrode 21, i.e., in a rectangular shape having the same pattern as the piezoelectric device 20 when viewed in plan. The undersurface of the piezoelectric membrane 24 is in contact with the upper surface of the main electrode portion 22A of the lower electrode 22, whereas the upper surface of the piezoelectric membrane 24 is in contact with the undersurface of the upper electrode 21.

The extension portion 22B of the lower electrode 22 has a separation groove 60 formed between adjoining cavities 6. In the present preferred embodiment, the separation groove 60 extends linearly in the longitudinal direction of the cavity 6, and separates the lower electrode 22 into parts corresponding to the cavities 6, respectively. In the present preferred embodiment, both ends of the separation groove 60 are positioned outside both ends of the cavity 6 with respect to the longitudinal direction. Therefore, the separation groove 60 is formed within the range from one end to the other end of a partitioning wall 61 that partitions the adjoining cavities 6 (see FIG. 4). As shown in FIG. 4, the separation groove 60 passes through the lower electrode 22 and the vibrating membrane 10, and reaches the partitioning wall 61 that partitions the two adjoining cavities 6. A part formed in the partitioning wall 61 of the separation groove 60 has a depth that exceeds ½ of the height (which is equal to the height of the cavity 6) of the partitioning wall 61.

In this way, the separation groove 60 separates the vibrating membrane 10 and the lower electrode 22 from each other that correspond to the adjoining cavities 6. This makes it possible for the vibrating membrane 10 of each cavity 6 to be displaced independently of the vibrating membrane 10 of the adjoining cavity 6. Additionally, the separation groove 60 is formed so as to have a depth that reaches the partitioning wall 61 between the adjoining cavities 6, and therefore it is also possible to displace the partitioning wall 61 in accordance with the displacement of the vibrating membrane 10.

As shown in FIG. 4, the piezoelectric membrane 24 has a thick membrane portion 25 at the middle in the lateral direction in a transverse plane along the lateral direction, and has thin membrane portions 26 at both sides in the lateral direction, respectively, in the transverse plane. The thick membrane portion 25 and the thin membrane portion 26 extend in the longitudinal direction of the cavity 6 in a linear belt shape. The width of the thick membrane portion 25 is, for example, equal to or below half the length in the lateral direction of the cavity 6. As shown in FIG. 2 and FIG. 3, in the thick membrane portion 25, the length in the longitudinal direction of the cavity 6 is shorter than the length in the longitudinal direction of the piezoelectric membrane 24. The thin membrane portions 26 are formed at both ends of the piezoelectric membrane 24, respectively. In other words, the thin membrane portion 26 is formed in a belt shape along the peripheral edge of the piezoelectric membrane 24 in such a manner as to annularly surround the thick membrane portion 25. The thick membrane portion 25 functions as a weight that contributes to an increase in inertial mass near the center of a movable part including the piezoelectric device 20 and the vibrating membrane 10. The upper electrode 21 is in contact with the thick membrane portion 25 and with the thin membrane portion 26.

A stepped surface 28 (see FIG. 2 and FIG. 4) that corresponds to a difference in the membrane thickness between the thick membrane portion 25 and the thin membrane portion 26 is formed at a boundary portion between the thick membrane portion 25 and the thin membrane portion 26. The surface of the thick membrane portion 25 and the stepped surface 28 intersect each other at substantially right angles, and, as a result, a bent portion 27 is formed. As mentioned above, the thin membrane portion 26 is annularly formed, and therefore the bent portion 27 is also annularly formed. In other words, the bent portion 27 has both side portions that extend in the longitudinal direction of the cavity 6 and both end portions that combine those side portions together at both end portions in the longitudinal direction of the cavity 6, respectively. When a driving voltage is applied between the upper electrode 21 and the lower electrode 22 so that the vibrating membrane 10 is displaced together with the piezoelectric device 20, the bent portion 27 functions as a starting-point portion at which the displacement starts.

As shown in FIG. 2 and FIG. 4, an inner wall surface 62 of the cavity 6 has a curved surface portion 62A at a place at which it comes into contact with the vibrating membrane 10. Preferably, the curved surface portion 62A covers the entire periphery of a peripheral edge at which the vibrating membrane 10 and the inner wall surface 62 come into contact with each other. The curved surface portion 62A is in contact with the vibrating membrane 10 in its upper edge, and is continuous with a flat surface portion 62B in its lower edge. The curved surface portion 62A has a concave curved surface formed so as to recede from an edge contiguous to the vibrating membrane 10 outwardly from the cavity 6 and toward the nozzle substrate 3. The flat surface portion 62B is a part of the inner wall surface 62 of the cavity 6. The lower edge of the flat surface portion 62B is in contact with the nozzle substrate 3. The flat surface portion 62B may extend along the normal direction of the vibrating membrane 10, or may incline with respect to the normal direction of the vibrating membrane 10. Preferably, for example, the flat surface portion 62B inclines outwardly from the cavity 6 and toward the nozzle substrate 3 with respect to the normal direction of the vibrating membrane 10 from an edge continuous with the curved surface portion 62A.

As shown in FIG. 6 that is an enlarged plan view, the upper electrode 21 has a notch portion 35 excavated inwardly from the peripheral edge. In the present preferred embodiment, the notch portion 35 is disposed at a corner of the upper electrode 21, and extends from one end of the upper electrode 21 linearly in the longitudinal direction of the cavity 6 with a predetermined length. A performance monitoring electrode 23 is disposed in the notch portion 35. The performance monitoring electrode 23 is in contact with the upper surface of the piezoelectric membrane 24. The performance monitoring electrode 23 is disposed in a region (in the notch portion 35) that overlaps with the cavity 6 when viewed in plan. Therefore, the performance monitoring electrode 23 faces the main electrode portion 22A of the lower electrode 22 with the piezoelectric membrane 24 placed between the performance monitoring electrode 23 and the main electrode portion 22A. The performance monitoring electrode 23 is formed in the shape of the letter U in the notch portion 35. A pair of terminal portions 23a and 23b are disposed at both end portions of the performance monitoring electrode 23. The pair of terminal portions 23a and 23b are positioned outside the notch portion 35. In the present preferred embodiment, the pair of terminal portions 23a and 23b are disposed on the actuator substrate 2 in a region outside the cavity 6, in more detail, in a region outside the protective substrate 4.

The pair of terminal portions 23a and 23b are connected to a drive-state monitoring circuit 36. The drive-state monitoring circuit 36 includes a temperature detection circuit for measuring the electric resistance between the terminal portions 23a and 23b, i.e., the electric resistance of the performance monitoring electrode 23 and hence detecting the temperature of the piezoelectric membrane 24. When the piezoelectric membrane 24 expands and contracts because of the inverse piezoelectric effect, the temperature of the piezoelectric membrane 24 rises correspondingly. The drive-state monitoring circuit 36 detects the operational state of the piezoelectric device 20 by measuring the temperature of the piezoelectric membrane 24. If a rise in temperature of the piezoelectric membrane 24 is not detected in spite of the fact that a driving voltage is being applied to the piezoelectric device 20, there is a possibility that abnormality is occurring in the piezoelectric device 20. In this way, in the present preferred embodiment, the performance monitoring electrode 23 is a temperature detection electrode that is used to detect the temperature of the piezoelectric membrane 24.

The driving IC 5 applies a driving voltage between the upper electrode 21 and the lower electrode 22, and drives the piezoelectric device 20. As a result, the piezoelectric membrane 24 is deformed by the inverse piezoelectric effect, and the vibrating membrane 10 is displaced in accordance therewith. As a result, the cavity 6 changes in volume, and its internal pressure rises, and, as a result, liquid droplets of ink are discharged from the discharge port 32 formed in the nozzle substrate 3. On the other hand, ink flowing out from the ink tank 8 is supplied to the cavity 6 through the ink supply passages 43, 44, through the common ink passage 49, and through the ink passage 50.

In the present preferred embodiment, the piezoelectric membrane 24 has the thick membrane portion 25 disposed so as to correspond to the vicinity of the center of the vibrating membrane 10. This thick membrane portion 25 has a function as a weight that locally increases inertial mass in the vicinity of the center of the vibrating membrane 10. This thick membrane portion 25 serving as a weight amplifies the displacement of the vibrating membrane 10 by its inertial mass when the vibrating membrane 10 is displaced by applying a driving voltage. This makes it possible to greatly change the volume of the cavity 6, and hence makes it possible to realize an inkjet head 1 excellent in driving performance.

The weight is made by using the thick membrane portion 25 of the piezoelectric membrane 24, and therefore it is possible to make a piezoelectric device 20 having a built-in weight by employing a simple arrangement.

The thick membrane portion 25 serving as a weight extends in the longitudinal direction of the cavity 6 that is rectangular when viewed in plan, and is formed in a belt shape whose length is equal to or below half the length in the lateral direction of the cavity 6, and is disposed in the vicinity of the center in the lateral direction of the cavity 6. This makes it possible to secure a sufficient interval from the side edge of the cavity 6 to the edge of the thick membrane portion 25. This makes it possible to effectively increase the displacement of the vibrating membrane 10 by the inertial mass of the thick membrane portion 25 serving as a weight, and hence makes it possible to improve the driving performance of the inkjet head 1.

Additionally, in the present preferred embodiment, the bent portion 27 is formed at the boundary portion between the thick membrane portion 25 and the thin membrane portion 26 of the piezoelectric membrane 24. The bent portion 27 is a peculiar or singular shape portion in the piezoelectric membrane 24, and provides a starting-point portion that serves as a starting point of the displacement of the piezoelectric membrane 24. Therefore, it is possible to ensure that the deformation (displacement) starts from the bent portion 27 that is a starting-point portion when the piezoelectric membrane is deformed (displaced). Therefore, the deformation (displacement) of the piezoelectric membrane 24 occurs in substantially the same way in a plurality of piezoelectric devices 20 and in a plurality of driving operations. As a result, it is possible to easily control an operation and to perform a highly accurate operation. Therefore, it is possible to realize a piezoelectric device 20 having high operation controllability. In accordance therewith, it is possible to provide an inkjet head 1 having high operation controllability. In other words, it is possible to provide an inkjet head 1 whose operation is controllable stably and accurately.

A protruding portion (thick membrane portion 25), which protrudes in the laminated direction of the layers consisting of the upper electrode 21, the piezoelectric membrane 24, and the lower electrode 22, and a recess portion (thin membrane portion 26) are disposed on the surface of the piezoelectric membrane 24, whereby the bent portion 27 is formed therebetween. In more detail, if it is assumed that there is a rectangular external border line that envelops the piezoelectric membrane 24 in the transverse plane, a level difference appears at the intermediate position of an upper side of the rectangular external border line. As a result, the bent portion 27 that is a peculiar shape point is formed, and discontinuance occurs midway in the external border line because of the bent portion 27. This makes it possible to generate the displacement of the piezoelectric membrane 24 while the bent portion 27 serves as a starting point.

The bent portion 27 has a kind of hollow shape that is hollowed in the laminated direction. In addition thereto, the bent portion 27 is a weak portion that is more weak than other parts included in the piezoelectric device 20. Therefore, it is possible for the bent portion 27 to reliably give the starting point of the displacement of the piezoelectric membrane 24.

Still additionally, the bent portion 27 is in contact with the peripheral edge of the piezoelectric device 20, and extends to a region inside the peripheral edge of the piezoelectric device 20. As a result, the displacement of the piezoelectric membrane 24 easily starts, and easily propagates to its whole. Therefore, it is possible to provide a piezoelectric device 20 having high responsiveness, and, in accordance therewith, it is possible to realize an inkjet head 1 provided with a piezoelectric device 20 having high operation controllability.

Still additionally, the bent portion 27 is continuous with the peripheral edge of the piezoelectric membrane 24, and therefore it is possible to simultaneously form it when the peripheral edge of the piezoelectric membrane 24 is processed. Therefore, it is possible to realize an inkjet head 1 provided with a piezoelectric device 20 having high operation controllability without increasing the number of manufacturing process steps.

Still additionally, the bent portion 27 that serves as a starting-point portion of displacement is disposed in the piezoelectric membrane 24, and therefore it is possible to allow the displacement of the piezoelectric membrane 24 to reliably occur from the bent portion 27, and hence is possible to realize an inkjet head 1 provided with a piezoelectric device 20 having high operation controllability.

Still additionally, the bent portion 27 has a shape that extends along the peripheral edge of the piezoelectric device 20, and therefore it is possible to reliably start the displacement of the piezoelectric membrane 24 in a wide range, and, in accordance therewith, it is possible to realize an inkjet head 1 provided with a piezoelectric device 20 having high operation controllability.

Still additionally, the bent portion 27 is positioned also in the vicinity of both ends in the longitudinal direction of the cavity 6, and therefore it is possible to start the displacement of the piezoelectric membrane 24 from the vicinity of both ends of the cavity 6. Therefore, it is possible to provide an inkjet head 1 that is excellent in not only operation controllability but also responsiveness to a driving voltage.

Still additionally, the bent portion 27 extends along a side in the longitudinal direction of the cavity 6, and therefore the displacement of the piezoelectric membrane 24 starts in a wide range in response to the application of a driving voltage. Therefore, it is possible to provide an inkjet head 1 that is excellent in not only operation controllability but also responsiveness to a driving voltage.

In the present preferred embodiment, the piezoelectric device 20 includes the performance monitoring electrode 23 serving as a third electrode in addition to the upper electrode 21 serving as a first electrode and the lower electrode 22 serving as a second electrode, and the performance monitoring electrode 23 is in contact with the piezoelectric membrane 24. It is possible to detect the state of the piezoelectric membrane 24 by means of the performance monitoring electrode 23. In the present preferred embodiment, the performance monitoring electrode 23 is a temperature detection electrode that detects the temperature of the piezoelectric membrane 24. The piezoelectric device 20 is operated by applying a driving voltage from the driving IC 5 to the upper electrode 21 and to the lower electrode 22, and, as a result, the temperature of the piezoelectric membrane 24 rises. Therefore, it is possible to monitor the operation of the piezoelectric device 20 by detecting the temperature of the piezoelectric membrane 24 by use of the performance monitoring electrode 23.

In the present preferred embodiment, the performance monitoring electrode 23 is disposed at the same layer as the upper electrode 21, and hence is capable of being formed in the same process step as the upper electrode 21 when the piezoelectric device 20 is manufactured. Therefore, it is possible to provide an inkjet head 1 including a piezoelectric device 20 having a state monitoring function without increasing the number of process steps.

Additionally, in the present preferred embodiment, the upper electrode 21 has the notch portion 35 excavated inwardly from the peripheral edge, and the performance monitoring electrode 23 is disposed so as to enter the notch portion 35. In other words, the performance monitoring electrode 23 is disposed so as to enter a region in which the upper electrode 21 and the piezoelectric membrane 24 are into contact with each other. Therefore, it is possible to monitor the state of the piezoelectric membrane 24 more accurately because the performance monitoring electrode 23 is in contact with the piezoelectric membrane 24 in a region in which the deformation for operations occurs. In other words, it is possible to detect the temperature in an operation region (deformation region) of the piezoelectric membrane 24.

Still additionally, in the present preferred embodiment, the performance monitoring electrode 23 faces the lower electrode 22 with the piezoelectric membrane 24 placed between the performance monitoring electrode 23 and the lower electrode 22. Therefore, the performance monitoring electrode 23 is in contact with the piezoelectric membrane 24 in an operation region used when a driving voltage is applied. This makes it possible to monitor the state of the piezoelectric membrane 24 more accurately. More specifically, it is possible to detect the temperature in an operation region of the piezoelectric membrane 24.

Still additionally, in the present preferred embodiment, the performance monitoring electrode 23 is disposed at a position at which it faces the cavity 6. Therefore, it is possible to detect the state of the piezoelectric membrane 24 in an operation region in which the deformation occurs for an ink discharge. This makes it possible to monitor the state of the piezoelectric membrane 24 more accurately.

In the present preferred embodiment, the performance monitoring electrode 23 has the two terminal portions 23a and 23b disposed at both ends. The drive-state monitoring circuit 36 detects electric resistance between the two terminal portions 23a and 23b. The electric resistance detected by the drive-state monitoring circuit 36 corresponds to the temperature of the piezoelectric membrane 24. In other words, the drive-state monitoring circuit 36 includes a temperature detection circuit that detects the temperature of the piezoelectric membrane 24 in the present preferred embodiment. It is possible to monitor the operation state of the piezoelectric membrane 24 by detecting the temperature of the piezoelectric membrane 24, particularly detecting the temperature of the operation region. This makes it possible to monitor the operational state of the inkjet head 1.

When the piezoelectric membrane 24 is deformed by applying a driving voltage between the upper electrode 21 and the lower electrode 22, an electromotive force generated by this deformation is generated between the performance monitoring electrode 23 and the lower electrode 22. Therefore, it is also possible to monitor the operation state of the piezoelectric membrane 24 by disposing a detection circuit that detects a potential difference between the performance monitoring electrode 23 and the lower electrode 22.

Additionally, in the present preferred embodiment, the inner wall surface 62 that defines the cavity 6 of the actuator substrate 2 has the curved surface portion 62A continuous with the cavity-side surface of the vibrating membrane 10 on the side of the cavity 6. Therefore, even if air bubbles are contained in ink supplied from the ink tank 8, these air bubbles are not easily captured into the cavity 6, and are swiftly discharged from the discharge port 32 together with the ink before forming an air bubble puddle. This makes it possible to restrain or prevent an air bubble puddle from being generated in the cavity 6. As a result, it is possible to restrain or prevent a change in volume of the cavity 6 from being absorbed by the shrinkage of air bubbles, and therefore it is possible to realize an excellently accurate amount of ink to be discharged that corresponds to a driving voltage applied to the piezoelectric device 20. Thus, it is possible to provide an inkjet head 1 that has improved ink discharge controllability.

Still additionally, in the present preferred embodiment, the curved surface portion 62A formed at the inner wall surface 62 of the actuator substrate 2 forms a curved line portion that is continuous with a contact point with the vibrating membrane 10 in a cross section that intersects the surface of the vibrating membrane 10 and that extends from the outside of the cavity 6 toward this contact point. In other words, the curved surface portion 62A has a shape formed so as to recede from a position at which it is in contact with the vibrating membrane 10 outwardly from the cavity 6. As a result, a corner portion does not exist between the inner wall surface 62 of the actuator substrate 2 and the vibrating membrane 10, and therefore an air bubble puddle is not easily generated. Therefore, it is possible to provide an inkjet head 1 that has improved ink discharge controllability.

Still additionally, in the present preferred embodiment, the inner wall surface 62 of the actuator substrate 2 has the flat surface portion 62B continuous with a lower part of the curved surface portion 62A (i.e., the side of the nozzle substrate 3). Therefore, it is possible to restrain or prevent air bubbles in ink from being captured by the inner wall surface 62 of the actuator substrate 2.

Still additionally, in the present preferred embodiment, the curved surface portion 62A covers the entire periphery of the boundary between the vibrating membrane 10 and the inner wall surface 62 that defines the cavity 6 of the actuator substrate 2. This makes it possible to more effectively restrain or prevent an air bubble puddle from occurring in the intersection between the inner wall surface 62 and the vibrating membrane 10, and, in accordance therewith, it is possible to improve ink discharge controllability.

Still additionally, in the present preferred embodiment, the separation groove 60 is formed between adjoining cavities 6, and this separation groove 60 passes through the vibrating membrane 10, and reaches the partitioning wall 61 with which the adjoining cavities 6 are partitioned. As a result, the vibrating membrane 10 of each cavity 6 is in a state in which a restraint with respect to other parts of the vibrating membrane 10 has been removed in the part of the separation groove 60, and therefore the amount of its displacement becomes larger. In addition thereto, the separation groove 60 reaches the partitioning wall 61, and therefore the partitioning wall 61 is also displaced in accordance with the displacement of the vibrating membrane 10. In other words, when the vibrating membrane 10 is deformed so as to protrude toward the ink cavity 6 as shown in FIG. 7, the upper end of the partitioning wall 61 is pulled to the inside of the cavity 6 by means of the vibrating membrane 10, and is deformed. As a result, the volume of the cavity 6 changes greatly between a state shown by the phantom line in which it has not yet been deformed and a state shown by the solid line in which it has been deformed. In accordance therewith, it is possible to increase the amount of ink discharge. From another viewpoint, it is possible to increase the rate of change of the volume of the cavity 6, and therefore it is possible to reduce the size of the cavity 6 to realize a fixed amount of ink discharge, and, in accordance therewith, it is possible to make the inkjet head 1 small in size.

Still additionally, in the present preferred embodiment, the separation groove 60 is formed continuously in a range from one end to the other end of the partitioning wall 61 with which a pair of adjoining cavities 6 are partitioned (see FIG. 3). In other words, the separation groove 60 is formed so as to be continuous over the whole of the boundary portion between adjoining cavities 6. Therefore, a restraint from surroundings to the vibrating membrane 10 corresponding to each cavity 6 is small. In addition thereto, it is possible to greatly displace the wide range of the partitioning wall 61 in response to the displacement of the vibrating membrane 10. This makes it possible to increase the amount of ink discharge or to make the inkjet head 1 small in size.

Still additionally, in the present preferred embodiment, the separation groove 60 passes through the lower electrode 22, and therefore a restraint by the lower electrode 22 is small. As a result, the amount of displacement of the vibrating membrane 10 becomes large, and the amount of displacement of the partitioning wall 61 also becomes large, and therefore it is possible to increase the amount of ink discharge or to make the inkjet head 1 small in size.

Still additionally, in the present preferred embodiment, the lower end of the separation groove 60 is positioned lower than the position of ½ of the height of the partitioning wall 61, and the depth of the separation groove 60 is set deeper than ½ of the height of the partitioning wall 61. This makes it possible to greatly deform the partitioning wall 61 in response to the deformation of the vibrating membrane 10, and hence makes it possible to greatly change the volume of the cavity 6 in accordance therewith. This makes it possible to increase the amount of ink discharge or to make the inkjet head 1 small in size.

Still additionally, in the present preferred embodiment, the driving IC 5 that drives the piezoelectric device 20 is mounted on the actuator substrate 2, and the bumps 53 each of which serves as an output terminal of a driving IC are disposed in a concentrated manner at the first surface 5*a* (opposite surface) facing the actuator substrate 2. These bumps 53 are joined to the lands 16 and 22C disposed on the wire on the actuator substrate 2. Therefore, a bonding wire or a cable (e.g., FPC) by which the actuator substrate 2 and the output terminal of the driving IC 5 are connected together is not required, thus making it possible to make the inkjet head 1 small in size.

Generally, in the driving IC 5 that drives the inkjet head 1, the number of output terminals is greater than the number of input terminals. Therefore, it is possible to achieve a great space-saving by removing cables and bonding wires connected to output terminals.

"Being disposed in a concentrated manner" denotes that most output terminals (preferably, all output terminals) of the driving IC 5 are disposed on the first surface 5*a*. However, input terminals are not hindered from being disposed on the first surface 5*a*.

Still additionally, in the present preferred embodiment, in the semiconductor substrate 51 of the driving IC 5, the active region 52 is disposed on the side opposite to the actuator substrate 2, and this active region 52 and the output terminal (bump 53) are connected together by means of the through via 55 (TSV). This makes it possible to dispose the output terminals in a concentrated manner on the first surface 5*a* on the side of the actuator substrate 2 of the driving IC 5. The driving IC 5 having the through via 55 is not required to draw and turn a wire from the active region 52 to the non-active surface side outside the semiconductor substrate 51, and therefore it is possible to make itself small in size. As a result, it is possible to contribute to a reduction in size of the inkjet head 1.

The driving IC 5 includes the plurality of input terminals 56 disposed on the second surface 5*b* on the side opposite to the first surface 5*a*. These input terminals 56 are connected to the FPC 57 through the bonding wire 58. The FPC 57 is connected to, for example, a control IC. The number of the input terminals 56 of the driving IC 5 is not so large, and therefore the inkjet head 1 does not become so large in size even if the input terminal 56 and the FPC 57 are connected together by means of wire bonding.

FIG. 8 is a schematic cross-sectional view showing an arrangement example of the piezoelectric membrane 24. The lower electrode 22 is formed on the vibrating membrane 10, and the piezoelectric membrane 24 is formed on the lower electrode 22, and the upper electrode 21 is formed on the piezoelectric membrane 24. The lower electrode 22 is made of, for example, a Pt/Ti laminated film in which a Ti film is a lower layer and in which a Pt film is an upper layer. The upper electrode 21 is made of, for example, an Ir/IrO$_2$ laminated film in which an IrO$_2$ film is a lower layer and in which an Ir film is an upper layer.

The piezoelectric membrane 24 includes an adhesion layer 71 formed on the surface of the lower electrode 22, a seed layer 72 formed on the adhesion layer 71, and a plurality of sintered-unit PZT layers 73 stacked together on the seed layer 72.

The term "sintered-unit PZT layer" denotes a PZT layer that is formed by a sintering process in which a single or a plurality of gelled films, each of which is formed by gelling an application film of a precursor solution including PZT, are stacked together and are then sintered by heat treatment. A gelled-film forming process that forms gelled films includes an applying step that forms an application film by applying a precursor solution including PZT, a drying step that dries the application film, and a calcining step that gels the application film that has undergone the drying step. This gelled-film forming process is performed once or a plurality of times, and then sintering is performed, and, as a result, a sintered-unit PZT layer 73 is formed. In other words, the sintered-unit PZT layer 73 is formed by the sol-gel method.

A solvent, in addition to PZT, is contained in the precursor solution. In the applying step, for example, a precursor solution is spin-coated. The drying step is performed under a temperature environment of, for example, 140° C. The drying step may be performed by natural seasoning. In the calcining step, heat treatment of, for example, a temperature (e.g., 300° C.) less than the melting point (327.5° C.) of lead may be applied to an application film that has undergone the drying step. In the sintering process, heat treatment of, for example, 700° C. is applied to a gelled application film. The sintering process may be performed by RTA (Rapid Thermal Annealing).

The adhesion layer 71 is a layer disposed to raise adhesive properties between the piezoelectric membrane 24 and the lower electrode 22. The adhesion layer 71 is made of, for example, a TiO layer. The TiO layer can be formed by, for example, the sol-gel method or the sputtering method.

The seed layer 72 is a layer disposed to improve the crystallinity and the adhesive properties of PZT, and is made of, for example, a PZT seed layer of PZT or a TiO seed layer of TiO. The seed layer 72 may be formed by the sol-gel method although it is preferable to form the seed layer 72 by the sputtering method. When it is formed by the sputtering method, an electric field is generated near the lower electrode 22 during its formation, and therefore a seed layer 72 that has crystals grownup in a polarized state and that has a uniform orientation direction is formed. In this case, the seed layer 72 becomes a columnar structure layer made of crystal grains that have grown up in a pillar shape in the normal direction of the lower electrode 22. When it is formed by the sol-gel method, the application of a precursor solution, the drying of an application film, the gelling by heating the application film that has been dried are performed in this order, and one sheet of gelled application film is formed, and this application film is sintered, and, as a result, a seed layer 72 is formed. The thickness of the seed layer 72 is, for example, about 5 nm to 500 nm.

In the present preferred embodiment, the seed layer 72 (e.g., PZT seed layer) is formed by the sputtering method, and the sol-gel method is performed on the seed layer 72 repeatedly a plurality of times, and, as a result, a plurality of sintered-unit PZT layers 73 are sequentially stacked together. The seed layer formed by the sputtering method appears as a columnar structure layer 75, and the sintered-unit PZT layer 73 formed by the sol-gel method appears as an amorphous structure layer 76.

The piezoelectric membrane 24 formed in this way includes the seed layer 72 made of the columnar structure layer 75 and the plurality of sintered-unit PZT layers 73 that are stacked together contiguously with the seed layer 72 and that form the amorphous structure layer 76 of piezoelectric material. The columnar structure layer 75 has uniformly-oriented crystals. The amorphous structure layer 76 has fine film quality and is excellent in breakdown voltage. Additionally, the amorphous structure layer 76 is stacked on the columnar structure layer 75 contiguously therewith, and hence follows the orientation of the columnar structure layer 75. Therefore, the piezoelectric membrane 24 including the columnar structure layer 75 and the amorphous structure layer 76 that are stacked on each other is excellent both in orientation and in breakdown voltage. This makes it possible to provide an inkjet head 1 driven by the piezoelectric device 20 that has the piezoelectric membrane 24 that is excellent in orientation and in breakdown voltage.

When the columnar structure layer 75 has the <100> orientation, the amorphous structure layer 76 is also a layer that is greatly apt to have this orientation. In this case, the piezoelectric membrane 24 has the property of having a great displacement resulting from the inverse piezoelectric effect when a voltage is applied and the property of having a great electromotive force resulting from the piezoelectric effect when it is deformed. On the other hand, when the columnar structure layer 75 has the <111> orientation, the amorphous structure layer 76 is also a layer that is greatly apt to have this orientation. In this case, the piezoelectric membrane 24 has the property of easily controlling the magnitude of a displacement resulting from the inverse piezoelectric effect when a voltage is applied and the property of having a stable electromotive force resulting from the piezoelectric effect when it is deformed.

Therefore, it is possible to realize an inkjet head 1 having excellent properties by controlling the orientation of the columnar structure layer 75 in accordance with desired properties. For example, when the columnar structure layer 75 has the <100> orientation, it is possible to increase the displacement of the vibrating membrane 10, and therefore it is possible to provide an inkjet head 1 having excellent driving performance. On the other hand, when the columnar structure layer has the <111> orientation, it is easy to control the magnitude of a displacement resulting from the inverse piezoelectric effect when a voltage is applied, and therefore it is possible to provide an inkjet head 1 having excellent controllability.

As described above, it is possible to deposit the columnar structure layer 75 by the sputtering method, and therefore it is possible to form the columnar structure layer 75 having high orientation controllability. In addition thereto, it is possible to form the columnar structure layer 75 having high orientation controllability by depositing a piezoelectric material in a polarized state. More specifically, it is possible to form a uniformly-oriented columnar structure layer 75 by depositing a piezoelectric material by the sputtering method in a state in which an electric field is being applied. As described above, it is possible to form the amorphous structure layer 76 by the sol-gel method, and therefore it is possible to form an amorphous structure layer 76 that is fine and that has high breakdown voltage.

If the columnar structure layer 75 and the amorphous structure layer 76 are made of the same kind of piezoelectric material (e.g., PZT), it is possible to more strictly control the orientation of the amorphous structure layer 76, and therefore it is possible to provide a piezoelectric membrane 24 excellent in orientation and in breakdown voltage.

It is possible to apply the thus formed piezoelectric membrane 24 to a piezoelectric actuator other than the inkjet head 1 or to a piezoelectric sensor typified by a microphone and by an ultrasonic sensor. In other words, in the piezoelectric actuator, a driving voltage is applied between the upper electrode 21 and the lower electrode 22, and, as a result, it is possible to deform the piezoelectric membrane 24 by the inverse piezoelectric effect. In the piezoelectric sensor, on the other hand, the piezoelectric membrane 24 is deformed by an external force, and, as a result, it is possible to generate a voltage between the upper electrode 21 and the lower electrode 22 by the piezoelectric effect. It is possible to realize a piezoelectric actuator or a piezoelectric sensor that has excellent properties by controlling the orientation of the columnar structure layer 75 in accordance with desired properties. For example, when the columnar structure layer 75 has the <100> orientation, the piezoelectric membrane 24 has the property of having a great displacement resulting from the inverse piezoelectric effect when a voltage is applied and the property of having a great electromotive force resulting from the piezoelectric effect when it is deformed. Therefore, it is possible to realize a piezoelectric actuator that is excellent in driving performance or a piezoelectric sensor that is high in sensitivity. On the other hand, when the columnar structure layer 75 has the <111> orientation, the piezoelectric membrane 24 has the property of easily controlling the magnitude of a displacement resulting from the inverse piezoelectric effect when a voltage is applied and the property of having a stable electromotive force resulting from the piezoelectric effect when it is deformed. Therefore, it is possible to realize a piezoelectric actuator that is excellent in controllability or a piezoelectric sensor that performs stable outputting.

Figure 9A:
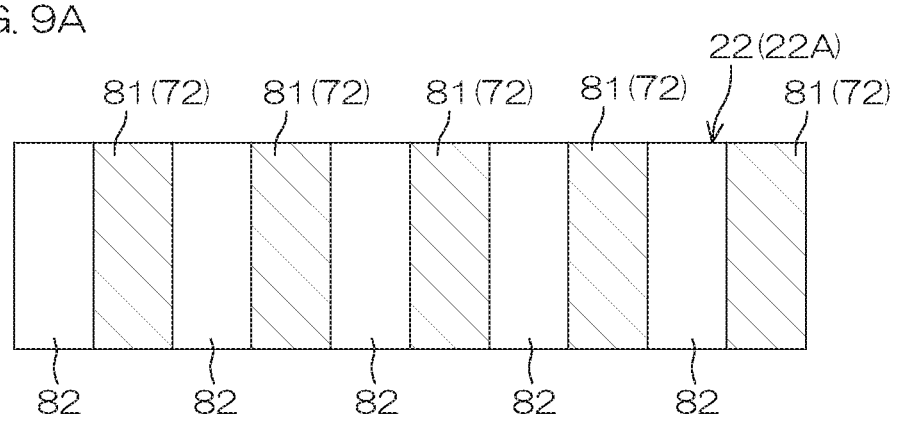
FIG. 9A and FIG. 9B are pictorial plan views, each showing a pattern example of a seed layer to form a piezoelectric membrane.
Figure 9B:
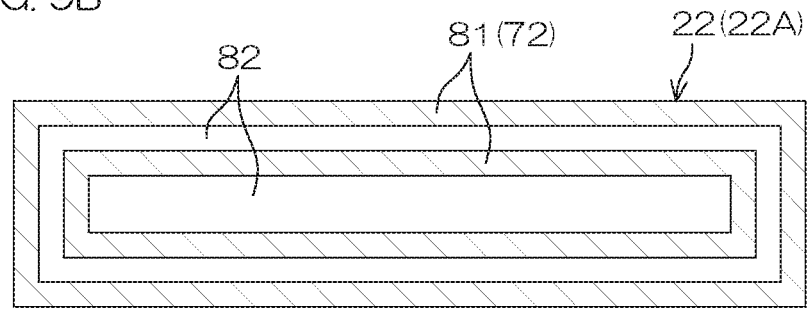

FIG. 9A and FIG. 9B are pictorial plan views to describe the feature of patterns of the seed layer 72. The seed layer 72 (shown by shading for clarification) may be formed locally as illustrated in FIG. 9A and FIG. 9B although the seed layer 72 may be formed in the entire area of the surface of the lower electrode 22. In other words, the seed layer 72 may be formed in a seed formation region 81 that is set on the lower electrode 22 (particularly, the main electrode portion 22A) serving as a ground layer, and the seed layer 72 may not be formed in a seed non-formation region 82 that is set on the lower electrode 22. The piezoelectric material layer may be formed so as to straddle the seed formation region 81 and the seed non-formation region 82.

There is a difference in orientation, and, in accordance therewith, there is a difference in properties between a piezoelectric material formed so as to be contiguous to the seed layer 72 and a piezoelectric material formed so as to be contiguous to the ground layer (i.e., the lower electrode 22) without being contiguous to the seed layer 72. Therefore, it is possible to acquire a piezoelectric membrane 24 having intermediate properties by disposing the seed formation region 81 in which the seed layer 72 is formed and the seed non-formation region 82 in which the seed layer 72 is not formed and by forming a piezoelectric material layer so as to straddle these regions. Therefore, it is possible to acquire a piezoelectric membrane 24 having various properties by variously setting an area ratio or a disposition pattern between the seed formation region 81 and the seed non-formation region 82. Therefore, it is possible to provide a piezoelectric membrane 24 in which properties are controlled in accordance with the purpose of use.

The piezoelectric membrane 24 includes a first orientation region that is formed in the seed formation region 81 and that has an orientation following a first direction and a second orientation region that is formed in the seed non-formation region 82 and that has an orientation following a second direction. The first orientation region and the second orientation region have mutually different properties according to these orientation directions. Therefore, it is possible to provide a piezoelectric membrane 24 having various properties in accordance with the area ratio, the disposition pattern, etc., between the seed formation region 81 and the seed non-formation region 82.

The orientation direction (first direction) of the piezoelectric material layer of the seed formation region 81 is, for example, <100>. The orientation direction (second direction) of the piezoelectric material layer of the seed non-formation region 82 is, for example, <111>. More specifically, when there is a Pt layer on the surface of the lower electrode 22, the piezoelectric material layer having the orientation of <111> is formed while being influenced by its orientation. The piezoelectric material layer having the orientation of <100> has a great inverse piezoelectric effect. Therefore, when this is applied to the piezoelectric device 20, it is possible to acquire a great displacement characteristic and therefore it is possible to increase the amount of ink discharge of the inkjet head 1. On the other hand, the piezoelectric material layer having the orientation of <111> has stable piezoelectric performance. Therefore, when this is applied to the piezoelectric device 20, it is possible to acquire stable driving performance, and therefore it is possible to control the amount of ink discharge of the inkjet head 1 accurately and stably. Therefore, the regions of the piezoelectric material layers having those orientations are allowed to exist together, and, as a result, it becomes possible to make the strength and the stability of piezoelectric performance compatible with each other in accordance with desired properties. In other words, the area ratio and the disposition pattern between the first orientation region and the second orientation region are set in accordance with necessary control accuracy and necessary displacement, and, as a result, it is possible to provide an inkjet head 1 with desired driving performance.

In the examples of FIGS. 9A and 9B, the seed formation region 81 and the seed non-formation region 82 include three or more separated regions in total. In addition thereto, the seed formation region 81 and the seed non-formation region 82 are alternately disposed on the lower electrode 22 (the main electrode portion 22A). The seed formation region 81 and the seed non-formation region 82 are alternately disposed in this way, and therefore the piezoelectric material layer becomes apt to have intermediate properties. Therefore, it is possible to provide a piezoelectric membrane 24 having high property controllability.

In the example of FIG. 9A, the seed formation region and the seed non-formation region 82 are alternately disposed in a stripe manner. As a result, the degree of orientation coexistence rises, and therefore it is possible to provide a piezoelectric membrane 24 having even higher property controllability.

More specifically, in the example of FIG. 9A, the seed formation region 81 and the seed non-formation region 82 are formed in rectangular shapes, respectively, and are alternately disposed such that sides of adjoining rectangular shapes are allowed to coincide with each other. The plurality of seed formation regions 81 and the plurality of seed non-formation regions 82 form a rectangular region corresponding to the main electrode portion 22A of the lower electrode 22 as a whole. In this way, the rectangular seed formation regions 81 and the rectangular seed non-formation regions 82 are alternately disposed in a uniform manner, and, as a result, it is possible to provide a rectangular piezoelectric membrane 24 having high property controllability.

In the example of FIG. 9B, an annular seed formation region 81 and an annular seed non-formation region 82 placed inside or outside the annular seed formation region 81 are disposed. The annular seed formation region 81 and the annular seed non-formation region 82 are disposed inside or outside each other, and, as a result, it becomes easy to acquire intermediate properties according to each orientation. This makes it possible to provide a piezoelectric membrane 24 having high property controllability.

In addition thereto, it is possible to exert the influence of properties according to the orientation influenced by the seed layer 72 onto a wide range of the piezoelectric membrane 24 by having the annular seed formation region 81, thus making it possible to provide a piezoelectric membrane 24 having high property controllability.

Likewise, it is possible to exert the influence of properties according to the orientation influenced directly by the ground layer (the lower electrode 22) onto a wide range of the piezoelectric membrane 24 by having the annular seed non-formation region 82, thus making it possible to provide a piezoelectric membrane 24 having high property controllability.

The seed layer of each pattern of FIGS. 9A and 9B may be formed by the sputtering method or by the sol-gel method. Preferably, the seed layer 72 is made of a piezoelectric material (e.g., PZT).

FIG. 10A, FIG. 10B, FIG. 10C, and FIG. 10D show modifications concerning the disposition of a weight.

Figure 10A:
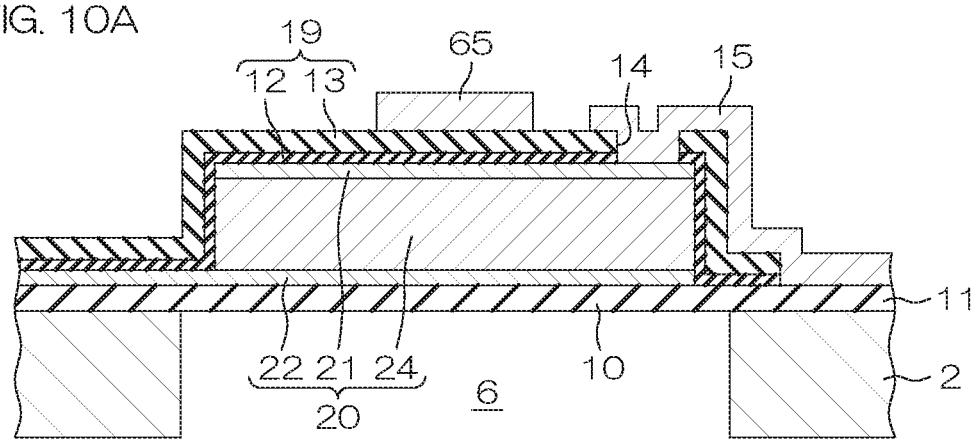
FIG. 10A to FIG. 10D show modifications concerning the disposition of a weight included in the piezoelectric device.

In the arrangement of FIG. 10A, the upper electrode 21 is covered with a protective film 19, and a weight 65 is disposed on the protective film 19. In this example, the protective film 19 is a laminated film consisting of the hydrogen barrier film 12 and the insulating film 13. The weight 65 may be made of a metal film. The weight 65 is disposed near the middle in the lateral direction of the cavity 6, and extends in the longitudinal direction of the cavity 6. The weight 65 is formed in a belt shape having a width shorter than the width in the lateral direction of the cavity 6 (preferably, a width of ½ of the width of the cavity 6). Therefore, an interval large enough not to obstruct the displacement of the vibrating membrane 10 is secured between the weight 65 and the side edge of the vibrating membrane 10. In addition thereto, the weight 65 is shorter than the length of the cavity 6 with respect to the longitudinal direction of the cavity 6, and an interval large enough not to obstruct the displacement of the vibrating membrane 10 is secured between both ends of the weight 65 and both ends of the cavity 6. Therefore, there is no fear that the displacement of the vibrating membrane 10 will be greatly restrained by the weight 65.

In this arrangement, the weight 65 is disposed on the upper electrode 21, and therefore it is possible to independently determine the disposition of the upper electrode 21 and that of the weight 65. This makes it possible to effectively apply a driving voltage to the piezoelectric membrane 24, and makes it possible to determine the disposition of the weight 65 to realize excellent driving performance. As a result, it is possible to realize an inkjet head 1 that is excellent in driving performance. In addition thereto, the protective film 19 is disposed between the upper electrode 21 and the weight 65, and therefore it is possible to protect the upper electrode 21 with the protective film 19 and possible to dispose the weight 65 thereon.

Figure 10B:
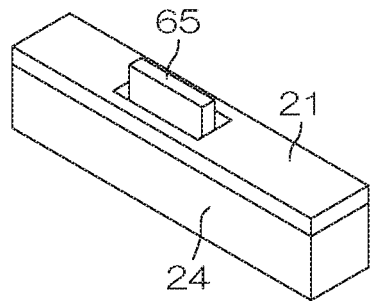

In the arrangement of FIG. 10B, the weight 65 is disposed at the same layer as the upper electrode 21. The weight 65 is made of the same material (metallic material) as the upper electrode 21, and is formed of a film that is thicker than the upper electrode 21. The weight 65 is disposed in the vicinity of the center of the cavity 6 when viewed in plan, and the upper electrode 21 has an annular shape (square annular shape) surrounding the weight 65. A gap is provided between the upper electrode 21 and the weight 65, which are apart from each other.

In this arrangement, the weight 65 is disposed at the same layer as the upper electrode 21, and therefore it is possible to use the same material for the upper electrode 21 and for the weight 65 and is possible to simultaneously form at least one part of those components. The inertial mass in the vicinity of the center of the vibrating membrane 10 is locally enlarged by making the film thickness of the weight 65 greater than the upper electrode 21. This makes it possible to realize an inkjet head 1 excellent in driving performance without greatly modifying the manufacturing process. In addition thereto, the annular upper electrode 21 is formed so as to surround the weight 65, and therefore it is easy to dispose the weight 65 in the vicinity of the center of the vibrating membrane 10. This makes it possible to enlarge the displacement of the vibrating membrane 10. In addition thereto, the upper electrode 21 has an annular shape that surrounds the center of the vibrating membrane 10, and therefore it is possible to efficiently drive the piezoelectric device 20. Thus, it is possible to realize an inkjet head 1 excellent in driving performance.

Figure 10C:
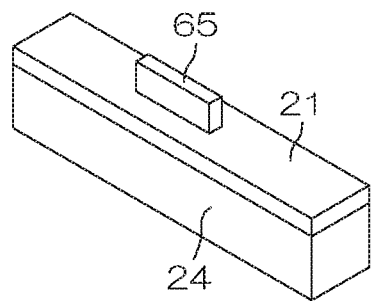

As shown in FIG. 10C, the upper electrode 21 and the weight 65 may be connected and united together although FIG. 10B shows a structure in which the upper electrode 21 and the weight 65 are separated from each other. In this case, the upper electrode 21 and the weight 65 become equal to each other in electric potential, and it is possible to apply a driving voltage to the piezoelectric membrane 24 through the weight 65. In other words, the weight 65 functions also as the upper electrode 21. This makes it possible to apply a driving voltage to a wide range of the piezoelectric membrane 24, and makes it possible to enlarge the displacement of the vibrating membrane 10 by means of the weight 65, and therefore it is possible to realize an inkjet head 1 excellent in driving performance.

Figure 10D:
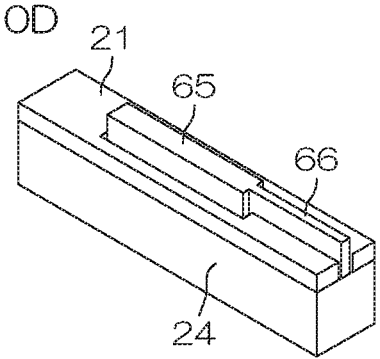

In the arrangement of FIG. 10D, an extraction electrode 66 that crosses the upper electrode 21 is formed from the weight 65 formed at the same layer as the upper electrode 21. The upper electrode 21 is formed in a horseshoe shape having both ends that are apart from each other between which the extraction electrode 66 is placed. Gaps, which are apart from each other, are formed between the upper electrode 21 and the weight 65 and between the upper electrode 21 and the extraction electrode 66, respectively.

In this arrangement, it is easy to dispose the weight 65 in the vicinity of the center of the vibrating membrane 10, and the upper electrode 21 is capable of effectively applying a driving voltage to the piezoelectric membrane 24, and therefore it is possible to realize an inkjet head 1 excellent in driving performance. Additionally, the extraction electrode 66 drawn out from the weight 65 is not in contact with the upper electrode 21, and therefore it is possible to independently applying a voltage to the weight 65 and to the upper electrode 21. This makes it possible to employ a driving method by which driving performance is further improved.

Piezoelectric equipment that uses a weight is not limited to an inkjet head. In other words, the piezoelectric equipment can include a vibrating membrane, a piezoelectric device disposed on the vibrating membrane, and a weight disposed so as to locally increase the inertial mass in the vicinity of the center of the vibrating membrane. The thus formed piezoelectric equipment can be a piezoelectric actuator or a piezoelectric sensor. The inkjet head is a kind of piezoelectric actuator.

In the piezoelectric actuator, when a driving voltage is applied to the piezoelectric device, the piezoelectric device is deformed by the inverse piezoelectric effect, and, in accordance therewith, the vibrating membrane is displaced. The weight is disposed so as to locally increase the inertial mass at the middle of the vibrating membrane, and therefore it is possible to enlarge the displacement of the vibrating membrane. This makes it possible to realize a piezoelectric actuator excellent in driving performance.

In the piezoelectric sensor, when the vibrating membrane is displaced, a voltage is generated in the piezoelectric device by the piezoelectric effect. The weight is disposed so as to locally increase the inertial mass at the middle of the vibrating membrane, and therefore it is possible to enlarge the displacement of the vibrating membrane. As a result, a large voltage is generated in the piezoelectric device, and therefore it is possible to realize a piezoelectric sensor excellent in detection performance (particularly, sensitivity). A microphone or an ultrasonic sensor can be mentioned as the piezoelectric sensor.

FIG. 11A to FIG. 11I show modifications concerning a starting-point portion of the displacement of the piezoelectric membrane 24.

Figure 11A:
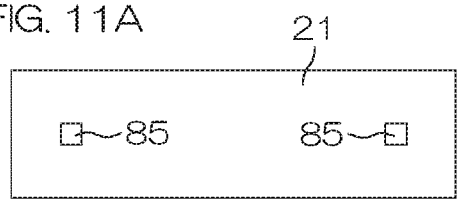
FIG. 11A to FIG. 11I show modifications concerning a starting-point portion of the displacement of a piezoelectric membrane.

In the arrangement of FIG. 11A, a pair of dot-shaped recess portions 85 each of which serves as a starting-point portion are formed in the vicinity of both ends of the upper electrode 21, respectively. The recess portion 85 may pass through the upper electrode 21, or may not pass therethrough. The recess portion 85 is an example of a bent portion, and has a shape hollowed in a laminated direction in which the upper electrode 21, the lower electrode 22, and the piezoelectric membrane 24 are stacked together. In the recess portion 85, at least one part of the upper electrode 21 has been removed, and therefore the recess portion 85 is a weak portion that is weaker than the other parts of the piezoelectric device 20. The recess portion 85 is disposed in a region inside the peripheral edge of the piezoelectric device 20, and is separated from the peripheral edge of the piezoelectric device 20. Although the recess portion 85 has a rectangular dot shape in this example, the recess portion 85 may have another dot shape, such as a polygonal dot shape, or a circular dot shape, or an elliptic dot shape.

According to this arrangement, the recess portion 85 serving as a starting-point portion is disposed in a region inside the peripheral edge of the piezoelectric device 20, and is separated from the peripheral edge of the piezoelectric device 20, and therefore it is easy for the displacement of the piezoelectric membrane 24 to propagate to its whole. Therefore, it is possible to provide an inkjet head 1 having high responsiveness, and, in accordance therewith, it is possible to realize an inkjet head 1 having high operation controllability. Additionally, it is possible to dispose the recess portion 85 serving as a starting-point portion by processing the upper electrode 21, and therefore it is possible to realize an inkjet head 1 having high operation controllability in an easy manufacturing process. Still additionally, the displacement of the piezoelectric membrane 24 starts from the recess portion 85 serving as a starting-point portion, and therefore it is possible to acquire stable responsiveness corresponding to a driving voltage and a stable amount of displacement. This makes it possible to provide an inkjet head 1 capable of performing stable, accurate operation control. Still additionally, it is possible to start the displacement of the piezoelectric membrane 24 from the vicinity of both ends of the cavity 6, and therefore it is possible to provide an inkjet head 1 excellent in not only operation controllability but also responsiveness to a driving voltage.

Figure 11B:
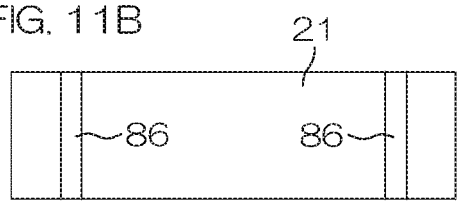

In the arrangement of FIG. 11B, the starting-point portion is formed of the groove 86 that is a recess portion formed at the upper electrode 21. The groove 86 may pass through the upper electrode 21 in the film-thickness direction, or may not pass therethrough. The groove 86 is disposed in the vicinity of both ends in the longitudinal direction of the cavity 6, and has a shape hollowed in the laminated direction, and provides a weak portion weaker than the other parts of the piezoelectric device 20. The groove 86 extends in the lateral direction of the cavity 6, i.e., extends along the peripheral edge of the piezoelectric device 20, and covers the entire width of the upper electrode 21. As a result, the groove 86 extends from a region inside the piezoelectric device 20 toward the peripheral edge of the piezoelectric device 20, and comes into contact with the peripheral edge of the piezoelectric device 20. Therefore, the groove 86 is formed by processing a region continuous with the peripheral edge of the piezoelectric device 20. Although the groove 86 is formed linearly in this example, the groove 86 may be formed in a polygonal line shape or a curved line shape.

According to this arrangement, the groove 86 serving as a starting-point portion extends from a region inside the peripheral edge of the piezoelectric device 20 toward the peripheral edge of the piezoelectric device 20, and comes into contact with the peripheral edge of the piezoelectric device 20. The groove 86 serving as a starting-point portion is in contact with the peripheral edge of the piezoelectric device 20, and therefore the displacement of the piezoelectric membrane 24 easily starts. Therefore, it is possible to provide a piezoelectric device 20 having high responsiveness, and, in accordance therewith, it is possible to realize an inkjet head 1 having high operation controllability. Additionally, the groove 86 serving as a starting-point portion extends along the peripheral edge of the piezoelectric device 20, and therefore it is possible to reliably start the displacement of the piezoelectric membrane 24 in a wide range, and, in accordance therewith, it is possible to realize an inkjet head 1 having high operation controllability.

Figure 11C:
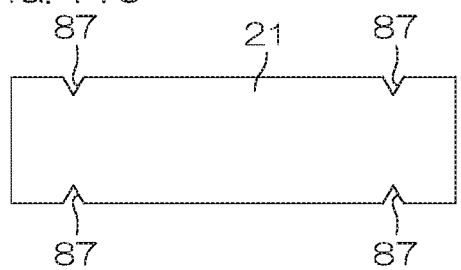

In the arrangement of FIG. 11C, notches 87 are formed at positions near both ends of the cavity 6 in both side edges in the longitudinal direction of the upper electrode 21. The notch 87 has a bent shape that is bent when viewed in plan, which is an example of a hollow shape that is hollowed toward the inside of the upper electrode 21. More specifically, the notch 87 has a hollow shape in a direction intersecting the laminated direction of the upper electrode 21 and the piezoelectric membrane 24 (in a direction perpendicular thereto). The notch 87 may pass through the upper electrode 21 in the film-thickness direction or may not pass therethrough. The notch 87 provides a weak portion weaker than the other parts of the piezoelectric device 20. The notch 87 is in contact with the peripheral edge of the piezoelectric device 20, and is formed by processing a region continuous with the peripheral edge of the piezoelectric device 20.

The notch 87 provides a starting-point portion from which the displacement is started when a driving voltage is applied to the piezoelectric device 20. Therefore, it is possible to provide an inkjet head 1 capable of easily controlling an operation and capable of performing a highly accurate operation. Additionally, the notch 87 serving as a starting-point portion is in contact with the peripheral edge of the piezoelectric device 20, and therefore the displacement of the piezoelectric membrane 24 easily starts. Therefore, it is possible to provide a piezoelectric device 20 having high responsiveness, and, in accordance therewith, it is possible to provide an inkjet head 1 having high operation controllability. Additionally, it is possible to simultaneously form the notch 87 when the peripheral edge of the piezoelectric device 20 (more specifically, the peripheral edge of the upper electrode 21) is processed, and therefore it is possible to realize a piezoelectric device 20 having high operation controllability without increasing the number of manufacturing process steps. Additionally, it is possible to start the displacement of the piezoelectric membrane 24 from the vicinity of both ends of the cavity 6, and therefore it is possible to provide an inkjet head 1 that is excellent in not only operation controllability but also responsiveness to a driving voltage.

Figure 11D:
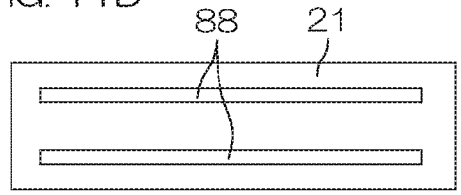

In the arrangement of FIG. 11D, the starting-point portion is formed of a pair of grooves 88 each of which is a recess portion formed at the upper electrode 21. The groove 88 may pass through the upper electrode 21 in the film-thickness direction, or may not pass therethrough. The grooves 88 extend along both side edges in the longitudinal direction of the cavity 6, i.e., along the peripheral edge of the piezoelectric device 20, and are disposed in the vicinity of both side edges thereof, respectively. The groove 88 has a shape hollowed in the laminated direction of the upper electrode 21 and the piezoelectric membrane 24, and provides a weak portion weaker than the other parts of the piezoelectric device 20. The groove 88 is disposed apart from the side edge of the upper electrode 21 in the lateral direction of the cavity 6. The groove 88 extends linearly and continuously from the vicinity of one end to the vicinity of the other end in the longitudinal direction of the upper electrode 21. These both ends are disposed apart from both ends of the upper electrode 21. Therefore, the groove 88 is separated from the peripheral edge of the piezoelectric device 20. The groove 88 extends in the longitudinal direction of the cavity 6, and therefore the displacement of the piezoelectric membrane 24 starts in a wide range in response to the application of a driving voltage. Therefore, it is possible to provide an inkjet head 1 that is excellent in not only operation controllability but also responsiveness to a driving voltage. The groove 88 may be formed in a polygonal line shape or a curved line shape, besides the linear shape.

Figure 11E:
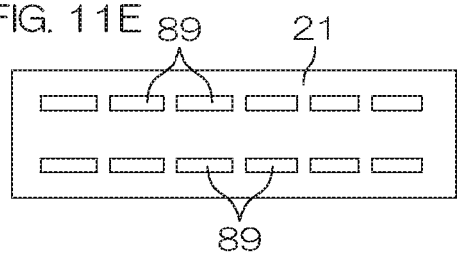

The arrangement of FIG. 11E differs from the arrangement of FIG. 11D in the fact that a groove 89 that linearly extends in the longitudinal direction of the cavity 6 is discontinuous although the arrangement of FIG. 11E is similar to the arrangement of FIG. 11D. Likewise, in this arrangement, the same effects as in the arrangement of FIG. 11D are acquired.

In the arrangements of FIGS. 11D and 11E, the grooves 88 and 89 extend from one end to the other end of the upper electrode 21, and may come into contact with the peripheral edge of the piezoelectric device 20. However, preferably, in this case, the upper electrode 21 is left in at least one part of the bottom of the groove 88 having a continuous shape of FIG. 11D so that the upper electrode 21 is not separated in the inside and the outside of the groove 88.

Figure 11F:
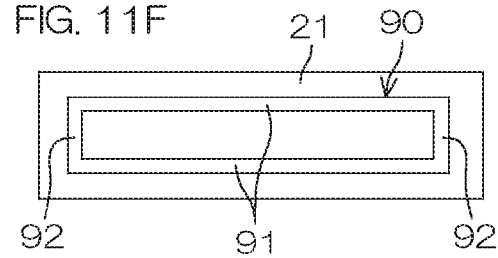

In the arrangement of FIG. 11F, an annular groove 90 that extends along the peripheral edge of the piezoelectric device 20 is formed at the upper electrode 21. In this example, the upper electrode 21 has a rectangular shape, and therefore the groove 90 is formed so as to have a rectangular, annular shape. The groove 90 includes a pair of long side portions 91 that extend in the longitudinal direction of the cavity 6 and a pair of short side portions 92 that extend in the lateral direction of the cavity 6. The long side portion 91 is disposed apart from the side edge of the upper electrode 21 (i.e., the peripheral edge of the piezoelectric device 20) in the vicinity of the side edge of the upper electrode 21. The short side portion 92 is disposed apart from both end edges of the upper electrode 21 (i.e., the peripheral edge of the piezoelectric device 20) in the vicinity of both end edges of the upper electrode 21. Therefore, the annular groove 90 does not come into contact with the peripheral edge of the piezoelectric device 20. Preferably, the upper electrode 21 is left in at least one part of the bottom of the groove 90 so that the upper electrode 21 is not separated in the inside and the outside of the annular groove 90.

Figure 11G:
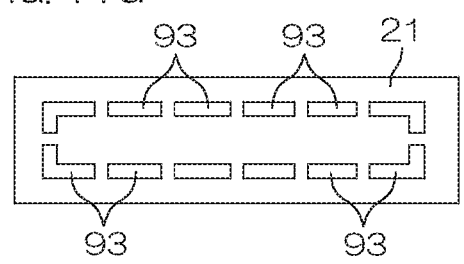

The arrangement of FIG. 11G differs from the arrangement of FIG. 11F in that an annular groove 93 is discontinuous although the arrangement of FIG. 11G is similar to the arrangement of FIG. 11F. In this arrangement, the groove 93 may pass through the upper electrode 21 in all parts.

Figure 11H:
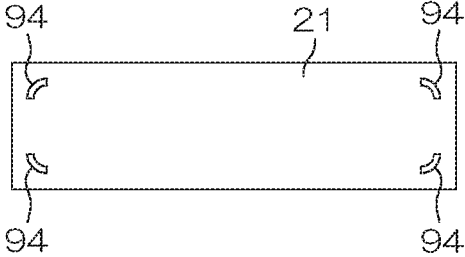
Figure 11:
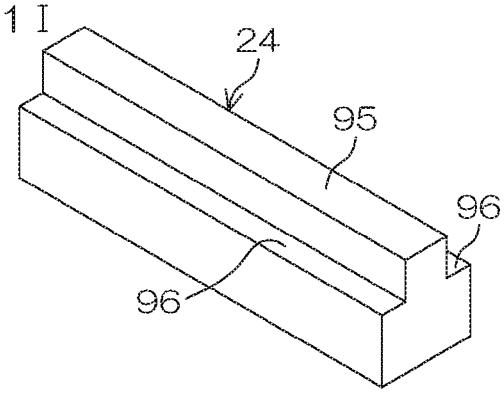

In the arrangement of FIG. 11H, recess portions 94 each of which has a substantially circular arc shape are formed at four corners, respectively, of the rectangular upper electrode 21. The recess portion may pass through the upper electrode 21, or may not pass therethrough. The recess portion has a circular arc shape that swells toward a corner of the upper electrode 21. The recess portions are disposed in the vicinity of both ends in the longitudinal direction of the cavity 6 and in the vicinity of both ends in the lateral direction of the cavity 6, respectively. The recess portions are formed so as to be separated from the peripheral edge of the piezoelectric device 20. Likewise, in this arrangement, when a driving voltage is applied to the piezoelectric device 20, the piezoelectric membrane 24 and the vibrating membrane 10 start to be deformed while the recess portion serves as a starting point of the displacement. This makes it possible to realize an inkjet head 1 that is stable and that has high responsiveness.

The arrangement of FIG. 11I is similar to each arrangement of FIGS. 2 to 5. In each arrangement of FIGS. 2 to 5, the annular thin membrane portion 26 is disposed at the peripheral edge of the piezoelectric membrane 24. On the other hand, in the arrangement of FIG. 11I, a pair of thin membrane portions 96 are disposed along both sides in the longitudinal direction of the piezoelectric membrane 24, respectively. The thin membrane portion 96 is formed over the overall length from one end to the other end in the longitudinal direction of the piezoelectric membrane 24. In both ends in the longitudinal direction of the piezoelectric membrane 24, the thin membrane portions 96 are formed only at both ends in the lateral direction of the piezoelectric membrane 24, and a thick membrane portion 95 exists therebetween. The thin membrane portion 96 is in contact with the peripheral edge of the piezoelectric device 20.

It is possible to apply the feature of providing a starting-point portion having a peculiar or singular shape (e.g., bent shape) that serves as a starting point of the displacement at the piezoelectric device not only to the inkjet head 1 but also to another type of piezoelectric actuator, such as a piezoelectric speaker, and is possible to further apply this feature to a piezoelectric sensor. In the piezoelectric sensor, a voltage is generated between the upper electrode and the lower electrode by the piezoelectric effect when an external force is applied onto the piezoelectric membrane. It is possible to ensure that the deformation (displacement) of the piezoelectric membrane starts from the starting-point portion when an external force is applied, and therefore the deformation (displacement) of the piezoelectric membrane likewise occurs with respect to a plurality of piezoelectric devices and with respect to an external force that is applied a plurality of times. This makes it possible to stabilize detection sensitivity and to perform a highly accurate operation. Examples of the piezoelectric sensor are a microphone, an ultrasonic sensor, etc.

Figure 12A:
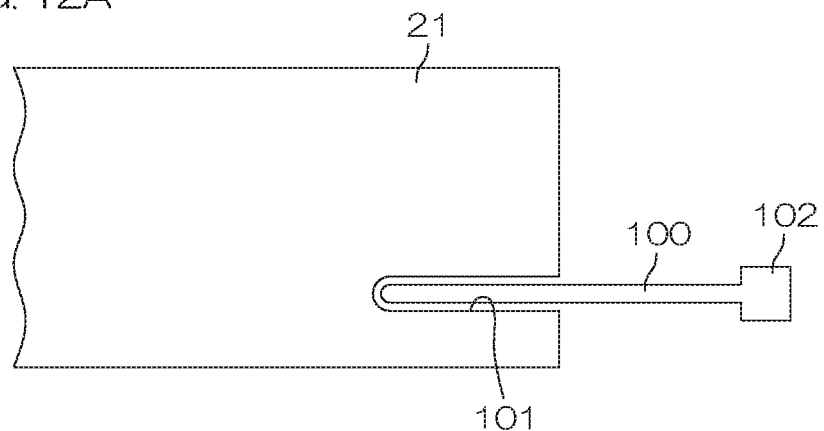
FIG. 12A and FIG. 12B show modifications concerning the feature of providing a third electrode, in addition to an upper electrode (first electrode) and a lower electrode (second electrode), at the piezoelectric device.
Figure 12B:
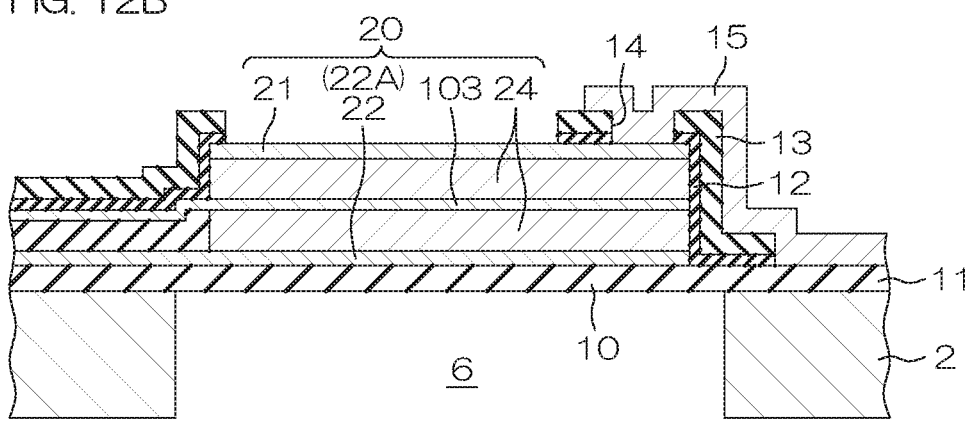

FIG. 12A and FIG. 12B show modifications concerning the feature of providing a third electrode, in addition to the upper electrode 21 (first electrode) and the lower electrode (second electrode).

In the arrangement of FIG. 12A, a performance monitoring electrode 100 is disposed at the same layer as the upper electrode 21. The performance monitoring electrode 100 enters a notch portion 101 formed in the upper electrode 21, and faces the lower electrode 22 through the piezoelectric membrane 24. The performance monitoring electrode 100 also faces the cavity 6. The performance monitoring electrode 100 is formed so as to be linear, and has a single terminal portion 102. The terminal portion 102 is disposed outside the notch portion 101. In this example, the notch portion 101 has a shape that extends in the longitudinal direction of the cavity 6 linearly and slenderly from an intermediate position of the end edge of the upper electrode 21. The performance monitoring electrode 100 linearly extends at least in the notch portion 101 so as to correspond to the shape of the notch portion 101. The performance monitoring electrode 100 is disposed apart from the peripheral edge of the notch portion 101, and hence is electrically separated from the upper electrode 21.

When a driving voltage is applied between the upper electrode 21 and the lower electrode 22, the piezoelectric membrane 24 is deformed, and an electromotive force generated by this deformation is generated between the performance monitoring electrode 100 and the lower electrode 22. Therefore, it is possible to monitor an operation state of the piezoelectric membrane 24 by disposing a detection circuit that detects a potential difference between the performance monitoring electrode 100 and the lower electrode 22.

In the arrangement of FIG. 12B, an intermediate electrode 103 serving as a third electrode is in contact with the piezoelectric membrane 24 between the upper electrode 21 and the lower electrode 22. More specifically, the intermediate electrode 103 is disposed at a membrane-thickness intermediate position of the piezoelectric membrane 24. The intermediate electrode 103 is parallel to the upper electrode 21 and to the lower electrode 22, and faces the upper electrode 21 and the lower electrode 22 with the piezoelectric membrane 24 therebetween. The intermediate electrode 103 is embedded in the piezoelectric membrane 24 in this way, and therefore it is possible to more accurately monitor a state of the piezoelectric membrane 24 by using this intermediate electrode 103.

Additionally, the piezoelectric membrane 24 is interposed between the intermediate electrode 103 and the lower electrode 22, and is interposed between the intermediate electrode 103 and the upper electrode 21, and therefore it is possible to allow the piezoelectric membrane 24 to be deformed by applying a driving voltage between the intermediate electrode 103 and the upper electrode 21 and/or between the intermediate electrode 103 and the lower electrode 22. Therefore, it is possible to provide an inkjet head 1 capable of operating in many operational modes. For example, the piezoelectric device 20 may be driven by applying a driving voltage to the intermediate electrode 103 in a state in which the upper electrode 21 and the lower electrode 22 have been each set at a ground potential.

The feature of including the third electrode besides the upper electrode (first electrode) and the lower electrode (second electrode) is applicable to not only a piezoelectric actuator such as an inkjet head but also a piezoelectric sensor such as a microphone or an ultrasonic sensor. For example, if the arrangement of FIG. 6 or FIG. 12A is applied to a piezoelectric sensor, a detection signal from the third electrode 23 (performance monitoring electrode), in addition to detection output signals from the upper and lower electrodes 21 and 22, is detected when an external force is applied to the piezoelectric membrane 24, and, as a result, it is also possible to detect the external force applied to the piezoelectric membrane 24 in more detail. In other words, it is possible to provide a piezoelectric sensor that has many detection modes. If the arrangement of FIG. 12B is applied to a piezoelectric sensor, an electromotive force is generated between the upper electrode 21 or the lower electrode 22 and the intermediate electrode 103 when an external force is applied to the piezoelectric membrane 24, and therefore it is possible to provide a piezoelectric sensor that has many detection modes.

FIG. 13A to FIG. 13D show modifications relative to the shape of the cavity 6.

Figure 13A:
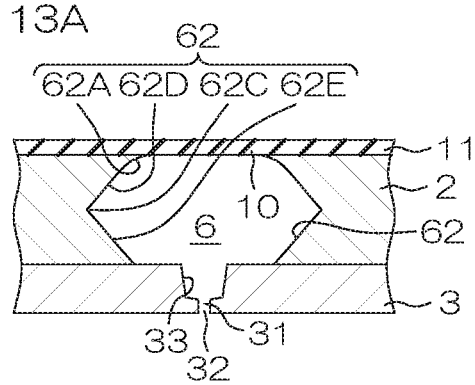
FIG. 13A to FIG. 13D are pictorial cross-sectional views, each showing a modification relative to the shape of a cavity included in the inkjet head.

In the arrangement of FIG. 13A, the inner wall surface 62 of the actuator substrate 2 has a recess portion 62C that is hollowed outwardly from the cavity 6. The recess portion 62C forms a valley portion that makes an obtuse angle in a cross section that intersects the surface of the vibrating membrane 10 on the side of the cavity 6. The lower edge of a first flat surface portion 62D is continuous with the upper side (the side of the actuator substrate 2) of the recess portion 62C. The first flat surface portion 62D is inclined with respect to both a direction parallel to the vibrating membrane 10 and a normal direction of the vibrating membrane 10. The upper edge of the first flat surface portion 62D is continuous with the curved surface portion 62A. A second flat surface portion 62E is continuous with the recess portion 62C on the lower side (the side of the nozzle substrate 3) of the recess portion 62C. The second flat surface portion 62E is inclined with respect to both the direction parallel to the vibrating membrane 10 and the normal direction of the vibrating membrane 10. The first flat surface portion 62D is inclined from the curved surface portion 62A toward the recess portion 62C outwardly from the cavity 6. The second flat surface portion 62E is inclined from the nozzle substrate 3 toward the recess portion 62C outwardly from the cavity 6. A plane including the first flat surface portion 62D and a plane including the second flat surface portion 62E make an obtuse angle in the cross section that intersects the surface of the vibrating membrane 10 on the side of the cavity 6. In other words, the recess portion 62C makes an obtuse angle in the cross section.

In this arrangement, the recess portion 62C forms an obtuse valley portion, and therefore it is possible to restrain or prevent air bubbles from being captured by the recess portion 62C. This makes it possible to improve ink discharge controllability. Additionally, it is easy to form the inner wall surface 62 having the first flat surface portion 62D and the second flat surface portion 62E, and the intersection (recess portion) of these portions makes an obtuse angle, and therefore it is possible to restrain or prevent an air bubble puddle from being formed at the intersection. This makes it possible to provide an inkjet head 1 that is easily produced in the manufacturing process and that has improved ink discharge controllability.

Figure 13B:
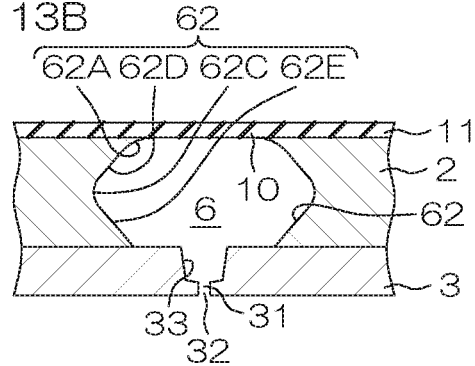

The arrangement of FIG. 13B differs from the arrangement of FIG. 13A in that the recess portion 62C has its inner surface formed in a curved surface without being angular although the arrangement of FIG. 13B is similar to the arrangement of FIG. 13A. The recess portion 62C forms a curved surface, and therefore it is possible to more effectively restrain or prevent air bubbles from being captured by the recess portion 62C. This makes it possible to improve ink discharge controllability.

Figure 13C:
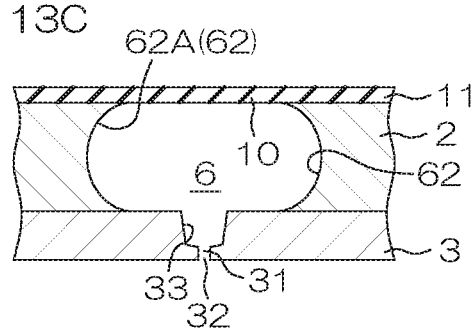

In the arrangement of FIG. 13C, the curved surface portion 62A contiguous to the undersurface of the vibrating membrane 10 is continuous from one surface to the other surface of the actuator substrate 2. This makes it possible to restrain or prevent an air bubble puddle from being generated on the inner wall surface of the cavity 6. Moreover, the curved surface portion 62A is contiguous also to the nozzle substrate 3, and therefore it is also difficult to capture air bubbles in the boundary between the inner wall surface 62 of the cavity 6 and the nozzle substrate 3. Therefore, it is possible to realize an inkjet head 1 that has further improved ink discharge controllability. Preferably, the curved surface portion 62A extends the entire periphery of the boundary between the inner wall surface 62 of the cavity 6 and the nozzle substrate 3. This makes it possible to more reliably restrain an air bubble puddle.

Figure 13D:
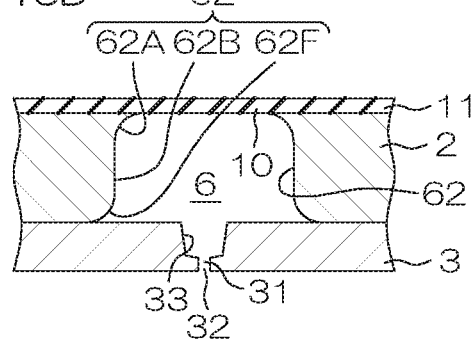

In the arrangement of FIG. 13D, on the side of the nozzle substrate 3, the inner wall surface 62 of the cavity 6 has a curved surface portion 62F that spreads while being curved outwardly. The lower edge of the curved surface portion 62F is contiguous to the nozzle substrate 3. According to this arrangement, the inner wall surface 62 of the cavity 6 has the curved surface portion 62F also on the side of the nozzle substrate 3, and therefore it is possible to restrain or prevent an air bubble puddle from being generated in the intersection between the nozzle substrate 3 and the inner wall surface 62. This makes it possible to provide an inkjet head 1 that has improved ink discharge controllability. Preferably, the curved surface portion 62F extends the entire periphery of the boundary between the inner wall surface 62 of the cavity 6 and the nozzle substrate 3. This makes it possible to more effectively restrain or prevent an air bubble puddle from being generated in the intersection between the inner wall surface of the cavity 6 and the nozzle substrate 3, and, in accordance therewith, makes it possible to improve ink discharge controllability. If the vibrating membrane 10 is disposed above the nozzle substrate 3, an air bubble puddle will be generated on the side of the vibrating membrane 10, and therefore there is no need to pay much attention to the capture of air bubbles on the side of the nozzle substrate 3.

Figure 14A:
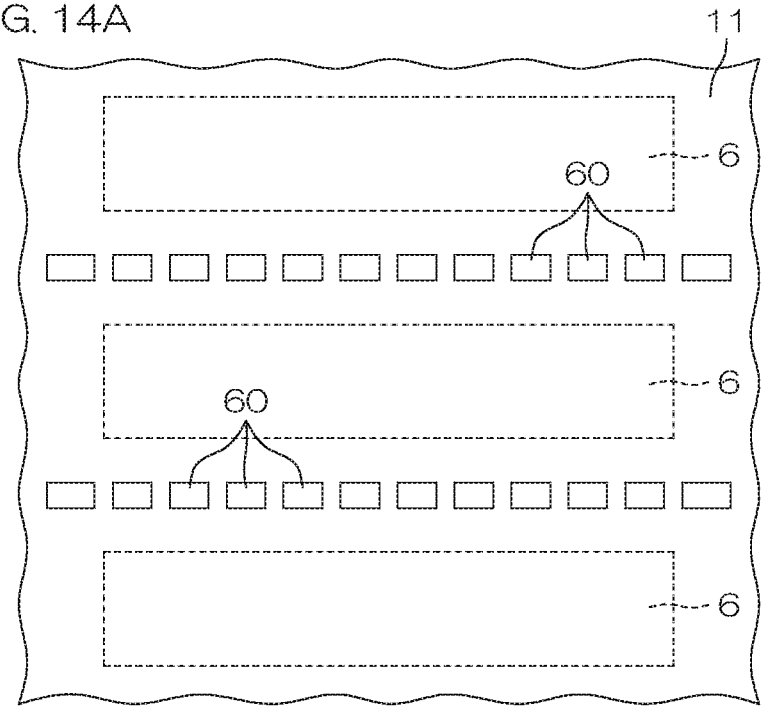
FIG. 14A and FIG. 14B show modifications concerning the separation of the vibrating membrane of each of the cavities.
Figure 14B:
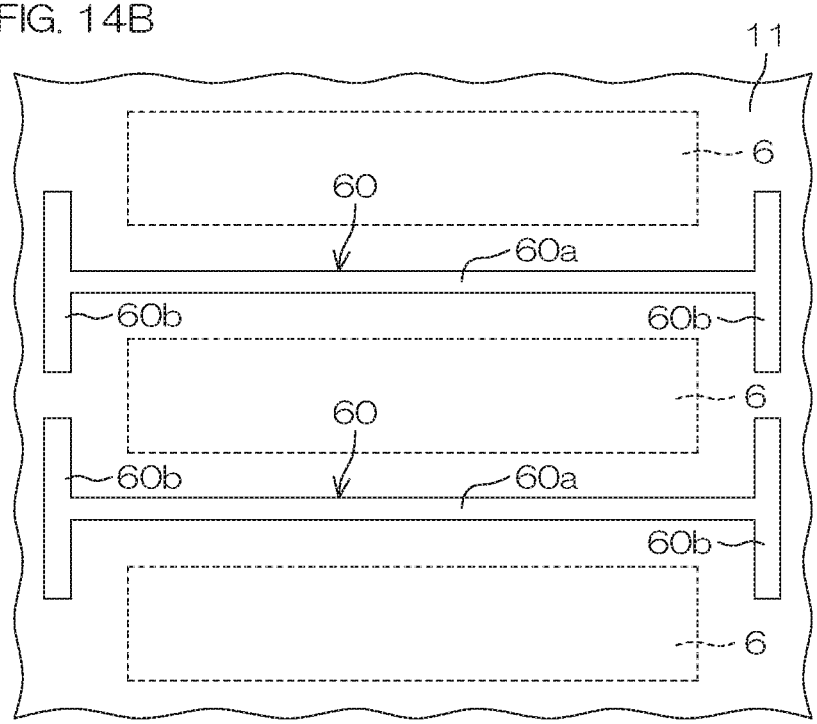

FIG. 14A and FIG. 14B show modifications concerning the feature of the separation of the vibrating membrane 10 of each cavity 6.

As shown in FIG. 14A, the separation groove 60 that separates the vibrating membrane 10 between the cavities 6 may be a groove having a discontinuous pattern. Even if the separation groove 60 is a discontinuous-pattern groove as mentioned above, it is possible to reduce restraints imposed from surroundings with respect to the vibrating membrane 10 corresponding to each cavity 6.

As shown in FIG. 14B, the separation groove 60 may further extend from the partitioning wall 61 by which a pair of adjoining cavities 6 are partitioned and may be formed so as to have a pattern that surrounds the cavity 6. This makes it possible to further reduce restraints imposed from surroundings with respect to the vibrating membrane 10, and hence makes it possible to more greatly displace the vibrating membrane 10 and the partitioning wall. In the example of FIG. 14B, the separation groove 60 includes a side edge separation groove 60a that extends along the side edge of the cavity 6 and an end edge separation groove 60b that extends along the end edge of the cavity 6. The end edge separation groove 60b is continuous with both ends of the side edge separation groove 60a. The side edge separation groove 60a and/or the end edge separation groove 60b may be a groove having a discontinuous pattern.

Figure 15A:
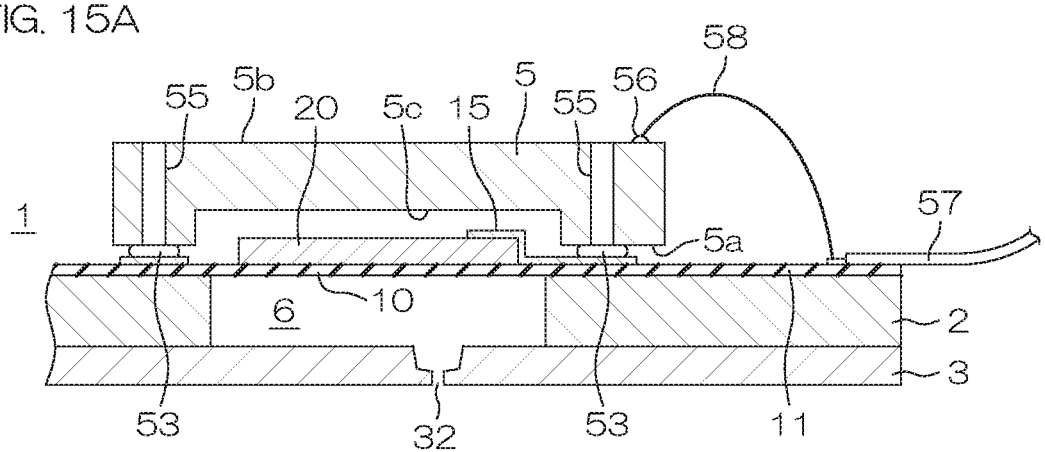
FIG. 15A to FIG. 15C show modifications concerning the disposition of a driving IC that drives the piezoelectric device.
Figure 15B:
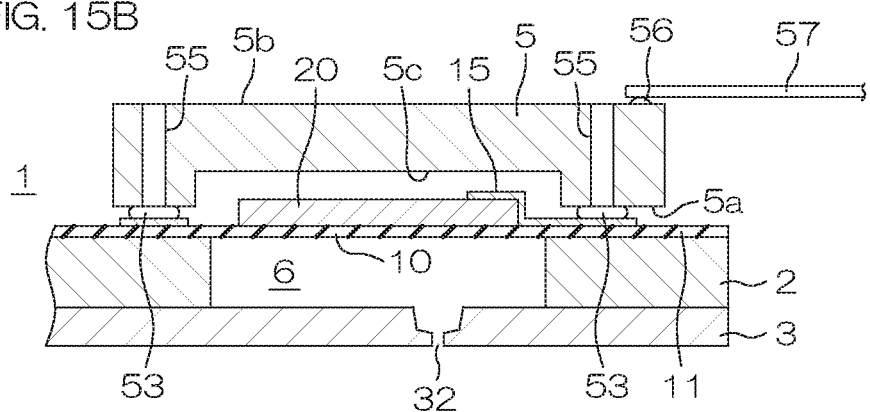
Figure 15C:
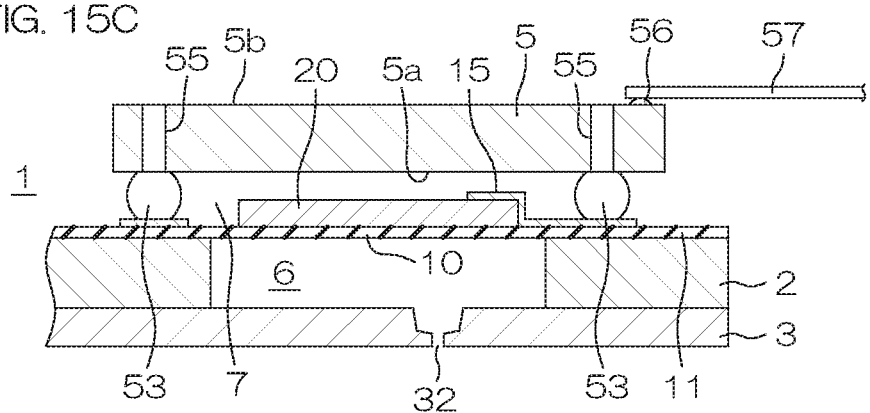

FIG. 15A, FIG. 15B, and FIG. 15C show modifications concerning the feature of the disposition of the driving IC 5.

In the arrangement of FIG. 15A, the driving IC 5 is mounted on the surface of the actuator substrate 2 so as to cover the piezoelectric device 20. Therefore, the driving IC 5 serves also as a protective substrate to protect the piezoelectric device 20. As a result, there is no need to independently dispose a protective substrate to protect the piezoelectric device 20. In addition thereto, it is possible to mount the driving IC 5 so as to overlap with the piezoelectric device 20 on the actuator substrate 2, and therefore it is possible to make the inkjet head 1 even smaller in size.

The driving IC 5 has a recess portion 5c formed on the first surface 5a (opposite surface) facing the surface of the actuator substrate 2. The piezoelectric device 20 is contained in the recess portion 5c. This makes it possible to secure an operating space in which the piezoelectric device 20 operates, and makes it possible to lower the height of the upper surface of the driving IC 5 (the second surface 5b, which is a surface opposite to the actuator substrate 2). This makes it possible to realize an inkjet head 1 that is small in size while securing the operating space of the piezoelectric device 20.

In the arrangement of FIG. 15B, the FPC 57 is joined directly to the input terminal 56 disposed on the upper surface (the second surface 5b) of the driving IC 5 although the arrangement of FIG. 15B is similar to the arrangement of FIG. 15A. As a result, wire bonding between the input terminal 56 of the driving IC 5 and the FPC 57 is not required, and therefore a space for wire bonding is not required to be provided on the actuator substrate 2. This makes it possible to make the inkjet head 1 even smaller in size.

In the arrangement of FIG. 15C, the driving IC 5 has a flat opposite surface facing the surface of the actuator substrate 2 as the first surface 5a, and the bump 53 forming an output terminal is formed on the first surface 5a. The driving IC 5 is disposed so as to cover the piezoelectric device 20 and is mounted on the actuator substrate 2.

A gap 7 is formed by the bump 53 between the surface of the actuator substrate 2 and the first surface 5a of the driving IC 5, and the piezoelectric device 20 is disposed in the gap 7, and faces the flat first surface 5a of the driving IC 5. In this way, the space formed by the bump 53 is used as a space for the disposition of the piezoelectric device 20 and for its operation. As a result, a recess portion is not required to be formed on the first surface 5a of the driving IC 5, and therefore the manufacturing process becomes easy.

The present invention can be embodied in other modes although the preferred embodiment of the present invention has been described as above. For example, the features relative to the piezoelectric device can be applied to not only an inkjet head but also a microphone, a pressure sensor, an acceleration sensor, an angular velocity sensor, an ultrasonic sensor, a speaker, or an IR sensor (heat sensor), each of which uses the piezoelectric membrane.

Besides, various design changes can be made within the scope of the appended claims.

The following features are extracted from this description and the accompanying drawings, in addition to the features recited in the appended claims.

A1. An inkjet head comprising:
a substrate that has an inner wall surface that defines a cavity in which ink is stored;
a vibrating membrane that is supported by the substrate and that defines the cavity; and
a piezoelectric device that is disposed on the vibrating membrane and that generates a change in volume of the cavity by displacing the vibrating membrane;
wherein the inner wall surface of the substrate has a curved surface portion continuous with the surface on the side of the cavity of the vibrating membrane.

Air bubbles in ink are captured, and an air bubble puddle is liable to be generated at a corner portion formed by the side wall of the cavity and by the undersurface of the vibrating membrane. If an air bubble puddle exists in the cavity, when a change in volume of the cavity is generated by the deformation of the vibrating membrane, there is a fear that a part of its volume change will be absorbed by the shrinkage of air bubbles. Therefore, there is a fear that an amount of ink corresponding to a driving voltage will not be discharged.

Therefore, the arrangement of Item A1 provides an inkjet head that has improved ink discharge controllability.

In the arrangement of Item A1, ink in the cavity is discharged by driving the piezoelectric device and by generating a change in volume of the cavity. The inner wall surface of the substrate that defines the cavity has the curved surface portion continuous with the cavity-side surface of the vibrating membrane. Therefore, even if air bubbles are contained in ink, the air bubbles are not easily captured into the cavity, and are swiftly discharged together with ink. This makes it possible to restrain or prevent an air bubble puddle from being generated in the cavity. As a result, it is possible to restrain or prevent a change in volume of the cavity from being absorbed by the shrinkage of air bubbles, and therefore it is possible to achieve the amount of ink discharge corresponding to a driving voltage applied to the piezoelectric device accurately. Thus, it is possible to provide an inkjet head that has improved ink discharge controllability.

A2. The inkjet head according to Item A1, wherein the curved surface portion has a curved line portion that is continuous with a contact point being in contact with the vibrating membrane in a cross section that intersects a surface of the vibrating membrane on the side of the cavity and that extends from the outside of the cavity toward the contact point.

According to this arrangement, the curved surface portion formed on the inner wall surface of the substrate has a shape that retreats from a position at which it comes into contact with the vibrating membrane outwardly from the cavity. As a result, a corner portion is not generated between the inner wall surface of the substrate and the vibrating membrane, and therefore an air bubble puddle is not easily generated. This makes it possible to provide an inkjet head that has improved ink discharge controllability.

A3. The inkjet head according to Item A1 or Item A2, wherein the curved surface portion is continuous from one surface of the substrate to an opposite surface of the substrate.

This arrangement makes it possible to realize an inkjet head that has improved ink discharge controllability.

A4. The inkjet head according to Item A1 or Item A2, wherein the inner wall surface of the substrate has a flat surface portion continuous with the curved surface portion.

This arrangement makes it possible to restrain or prevent air bubbles in ink from being captured by the inner wall surface of the substrate because the inner wall surface of the substrate is continuous with the flat surface portion from the curved surface portion.

A5. The inkjet head according to Item A4, wherein the inner wall surface of the substrate has a recess portion that is recessed outwardly from the cavity.

A6. The inkjet head according to Item A5, wherein the recess portion forms a valley portion that makes an obtuse angle in a cross section that intersects the surface of the vibrating membrane on the side of the cavity.

The recess portion forms the obtuse valley portion, and therefore it is possible to restrain or prevent air bubbles from being captured by the recess portion. This makes it possible to improve ink discharge controllability.

A7. The inkjet head according to Item A5, wherein the recess portion forms a curved surface.

This arrangement makes it possible to more effectively restrain or prevent air bubbles from being captured by the recess portion. This makes it possible to improve ink discharge controllability.

A8. The inkjet head according to any one of Items A5 to Item A7, wherein the first flat surface portion that is the flat surface portion continuous with the curved surface portion is continuous with the recess portion, wherein the inner wall surface of the substrate further includes a second flat surface portion that is placed on a side opposite to the first flat surface portion and that is continuous with the recess portion, and wherein a plane including the first flat surface portion and a plane including the second flat surface portion make an obtuse angle in a cross section that intersects the surface of the vibrating membrane on the side of the cavity.

It is easy to form the inner wall surface of the substrate that has the first and second flat surfaces. The intersection between the planes that include those surfaces, respectively, makes an obtuse angle. Therefore, it is possible to restrain or prevent an air bubble puddle from being generated in the recess portion. This makes it possible to provide an inkjet head that is easily produced in the manufacturing process and that has improved ink discharge controllability.

A9. The inkjet head according to any one of Items A1 to Item A8, further comprising a nozzle substrate that is combined to a side opposite to the vibrating membrane of the substrate and that has an ink discharge passage that leads to the cavity, wherein the inner wall surface of the substrate has a second curved surface portion continuous with the surface of the nozzle substrate on the side of the cavity.

According to this arrangement, the inner wall surface of the substrate has the curved surface portion also on the nozzle-substrate side, and therefore it is also possible to restrain or prevent an air bubble puddle from being generated in the intersection between the nozzle substrate and the inner wall surface of the substrate. This makes it possible to provide an inkjet head that has improved ink discharge controllability.

A10. The inkjet head according to Item A9, wherein the second curved surface portion extends an entire periphery of a boundary between the inner wall surface of the substrate and the nozzle substrate.

This arrangement makes it possible to more effectively restrain or prevent an air bubble puddle from being generated in the intersection between the inner wall surface of the substrate and the nozzle substrate, and makes it possible to improve ink discharge controllability in accordance therewith.

A11. The inkjet head according to any one of Items A1 to Item A10, wherein the curved surface portion extends an entire periphery of a boundary between the inner wall surface of the substrate and the vibrating membrane.

This arrangement makes it possible to more effectively restrain or prevent an air bubble puddle from being generated in the intersection between the inner wall surface of the substrate and the vibrating membrane, and makes it possible to improve ink discharge controllability in accordance therewith.

B1. An inkjet head comprising:

an actuator substrate that defines a cavity in which ink is stored;

a vibrating membrane that is supported by the actuator substrate and that defines the cavity;

a piezoelectric device that is disposed on the vibrating membrane and that changes a volume of the cavity by displacing the vibrating membrane; and a driving IC that is mounted on the actuator substrate and that drives the piezoelectric device;

wherein the driving IC includes a plurality of output terminals that are disposed on a first surface facing the actuator substrate in a concentrated manner and that are joined to the actuator substrate, and a plurality of input terminals disposed on a second surface on a side opposite to the first surface.

In a conventional technique, a driving IC that drives a piezoelectric device is disposed on, for example, a substrate that differs from an actuator substrate on which the piezoelectric device is formed. For example, about three hundred cavities and piezoelectric devices corresponding to these cavities are mounted on the actuator substrate. These piezoelectric devices and the driving IC are connected together through an FPC (flexible print-circuit board). More specifically, one end of the FPC is fixed to an actuator substrate, and the electrode of the piezoelectric device and a plurality of core wires of the FPC are subjected to wire bonding. On the other hand, the other end of the FPC is fixed to the substrate on which the driving IC is mounted, and the driving IC and a plurality of core wires of the FPC are subjected to wire bonding.

The driving IC has, for example, about three hundred output pins and about twenty input pins. About three hundred output pins among these pins are connected to the piezoelectric devices disposed on the actuator substrate through the FPC. About twenty input pins are connected to a control IC through another FPC or the like. Therefore, a place in which the FPC that has about three hundred core wires is fixed and a space for wire bonding by which those core wires are connected to electrodes of about three hundred piezoelectric devices are required to be secured on the actuator substrate. Additionally, the FPC having about three hundred core wires occupies a large space. Disadvantageously, these reasons cause an increase in size of the inkjet head.

Therefore, the arrangement of Item B1 provides an inkjet head having an advantageous structure for size reduction.

According to the arrangement of Item B1, when the driving IC applies a driving voltage to the piezoelectric device, the vibrating membrane is displaced together with the piezoelectric device, thus producing a change in volume of the cavity. As a result, ink in the cavity is discharged. The driving IC includes a plurality of output terminals disposed in a concentrated manner on the first surface facing the actuator substrate, and these output terminals are joined to the actuator substrate. In other words, the driving IC is mounted on the actuator substrate. Additionally, the driving IC includes a plurality of input terminals disposed on the second surface on the side opposite to the first surface. These input terminals may be connected to, for example, a control IC.

The output terminals of the driving IC are disposed in a concentrated manner on the first surface on the side of the actuator substrate, and these output terminals are joined to the actuator substrate, and therefore a cable (for example, FPC) by which the actuator substrate and the output terminals of the driving IC are connected together is not required. This makes it possible to make the inkjet head small in size.

Generally, in a driving IC to drive an inkjet head, the number of output terminals is greater than the number of input terminals. Therefore, it is possible to achieve a great space-saving by removing a cable connected to the output terminal.

"Output terminals are disposed in a concentrated manner" denotes that most output terminals (preferably, all output terminals) of the driving IC are disposed on the first surface. However, the input terminals are not prevented from being disposed on the first surface.

A plurality of input terminals may be disposed on the second surface in a concentrated manner. In other words, most input terminals (e.g., all input terminals) of the driving IC may be disposed on the second surface.

B2. The inkjet head according to Item B1, wherein the driving IC includes a semiconductor substrate, an active region that is disposed on a side opposite to the actuator substrate of the semiconductor substrate and that contains a semiconductor device, and a through via that connects the active region and the output terminal through the semiconductor substrate.

In this arrangement, in the semiconductor substrate of the driving IC, the active region is disposed on the side opposite to the actuator substrate, and the active region and the output terminal are connected by the through via (e.g., TSV: Through Silicon Via). This makes it possible to dispose the output terminals in a concentrated manner on the first surface on the actuator-substrate-side of the driving IC. The driving IC having the through via is not required to draw and turn a wire from the active region to the non-active surface side outside the semiconductor substrate, and therefore it is possible to make itself small in size. As a result, it is possible to contribute to a reduction in size of the inkjet head.

B3. The inkjet head according to Item B1 or Item B2, wherein a flexible print-circuit board is connected to the plurality of input terminals through a bonding wire.

The number of the input terminals of the driving IC is not so large, and therefore the inkjet head does not become so large in size even if the input terminal and the flexible print-circuit board are connected by means of wire bonding.

B4. The inkjet head according to Item B1 or Item B2, wherein a flexible print-circuit board is connected directly to the plurality of input terminals.

In this arrangement, wire bonding between the input terminal of the driving IC and the flexible print-circuit board is not required, and therefore a space for wire bonding is not required to be provided. This makes it possible to make the inkjet head even smaller in size.

B5. The inkjet head according to any one of Items B1 to Item B4, wherein the driving IC is mounted on the surface of the actuator substrate so as to cover the piezoelectric device.

In this arrangement, the driving IC is disposed so as to cover the piezoelectric device, and serves also as a protective substrate to protect the piezoelectric device. As a result, there is no need to independently dispose a protective substrate to protect the piezoelectric device. In addition thereto, it is possible to mount the driving IC so as to overlap with the piezoelectric device on the actuator substrate, and therefore it is possible to make the inkjet head even smaller in size.

B6. The inkjet head according to Item B5, wherein the driving IC has a recess portion that is formed on an opposite surface facing the surface of the actuator substrate and that houses the piezoelectric device.

This makes it possible to secure an operating space in which the piezoelectric device operates, and makes it possible to lower the height of an upper surface of the driving IC (which is a surface on the side opposite to the actuator substrate). This makes it possible to realize an inkjet head that is small in size while securing the operating space of the piezoelectric device.

B7. The inkjet head according to Item B5, wherein the driving IC has a flat opposite surface facing the surface of the actuator substrate, a bump forming the output terminal is formed on the opposite surface, a gap is formed by the bump between the surface of the actuator substrate and the opposite surface, and the piezoelectric device is disposed in the gap, and faces the flat opposite surface.

In this arrangement, the output terminal has the form of a bump, and, as a result, a space is secured between the opposite surface of the driving IC and the actuator substrate. This space is used as a space for disposing the piezoelectric device and for operating the piezoelectric device. This makes the manufacturing process easy because there is no need to forma recess portion on the opposite surface of the driving IC.

B8. An inkjet head driving IC that is mounted on an actuator substrate provided with a piezoelectric device used to discharge ink and that drives the piezoelectric device, the inkjet head driving IC comprising:

a plurality of output terminals that are disposed in a concentrated manner on a first surface facing the actuator substrate and that are joined to the actuator substrate; and a plurality of input terminals disposed on a second surface on a side opposite to the first surface.

This arrangement makes it possible to provide a driving IC that is advantageous to a size reduction of an inkjet head.

B9. The inkjet head driving IC according to Item B8, comprising a semiconductor substrate, an active region that is disposed on a side opposite to the actuator substrate of the semiconductor substrate and that contains a semiconductor device, and a through via that connects the active region and the output terminal through the semiconductor substrate.

B10. The inkjet head driving IC according to Item B8 or Item B9, further comprising a recess portion that is formed on an opposite surface facing the surface of the actuator substrate and that houses the piezoelectric device.

B11. The inkjet head driving IC according to Item B8 or Item B9, further comprising:

a flat opposite surface facing the surface of the actuator substrate; and a bump that forms the output terminal and that is formed on the flat opposite surface;

the bump having a height great enough to secure a gap capable of containing the piezoelectric device between the surface of the actuator substrate and the flat opposite surface.

Although the preferred embodiments of the present invention have been described in detail as above, these are merely specific examples used to clarify the technical contents of the present invention, and the present invention should not be understood as being limited to these examples, and the scope of the present invention is to be determined solely by the appended claims.

What is claimed is:

1. An inkjet head comprising:
    an actuator substrate that defines a cavity in which ink is stored;
    a vibrating membrane that is supported by the actuator substrate and that defines the cavity;
    a piezoelectric device that is disposed on the vibrating membrane and that changes a volume of the cavity by displacing the vibrating membrane; and
    a driving IC that is mounted on the actuator substrate and that drives the piezoelectric device;
    wherein the driving IC includes
    a plurality of output terminals that are concentrated on a first surface facing the actuator substrate and joined to the actuator substrate, and
    a plurality of input terminals disposed on a second surface on a side opposite to the first surface,
    and wherein
    the driving IC is mounted on a surface of the actuator substrate so as to cover the piezoelectric device, and
    the driving IC has a recess portion that is formed in an opposing surface thereof facing the surface of the actuator substrate and that houses the piezoelectric device.

2. The inkjet head according to claim 1, wherein the driving IC further includes a semiconductor substrate, an active region that is disposed on a side of the semiconductor substrate opposite to the actuator substrate and that contains a semiconductor device, and a through via that connects the active region and an output terminal of the plurality of output terminals through the semiconductor substrate.

3. The inkjet head according to claim 1, further comprising a flexible print-circuit board connected to the plurality of input terminals through a bonding wire.

4. The inkjet head according to claim 1, further comprising a flexible print-circuit board connected directly to the plurality of input terminals.

5. An inkjet head driving IC that is mounted on an actuator substrate provided with a piezoelectric device used to discharge ink and that drives the piezoelectric device, the inkjet head driving IC comprising:
    a plurality of output terminals that are concentrated on a first surface facing the actuator substrate and that are joined to the actuator substrate;
    a plurality of input terminals disposed on a second surface on a side opposite to the first surface; and
    a recess portion that is formed in an opposing surface facing a surface of the actuator substrate and that houses the piezoelectric device.

6. The inkjet head driving IC according to claim 5, further comprising a semiconductor substrate, an active region that is disposed on a side of the semiconductor substrate opposite to the actuator substrate, a semiconductor device contained in the active region, and a through via that connects the active region and an output terminal of the plurality of output terminals through the semiconductor substrate.

* * * * *